United States Patent
Parks

(10) Patent No.: US 8,098,316 B2
(45) Date of Patent: Jan. 17, 2012

(54) MULTIPLE OUTPUT CHARGE-COUPLED DEVICES

(75) Inventor: Christopher Parks, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 0 days.

(21) Appl. No.: 12/716,361

(22) Filed: Mar. 3, 2010

(65) Prior Publication Data

US 2010/0157118 A1 Jun. 24, 2010

(51) Int. Cl.
- H04N 3/14 (2006.01)
- H04N 3/16 (2006.01)
- H04N 5/335 (2011.01)
- H04N 9/04 (2006.01)
- H01L 27/00 (2006.01)
- H01L 31/062 (2006.01)

(52) U.S. Cl. ........ 348/311; 348/315; 348/294; 348/283; 250/208.1; 257/291

(58) Field of Classification Search .......... 348/294–324, 348/283; 250/208.1; 257/231
See application file for complete search history.

(56) References Cited

U.S. PATENT DOCUMENTS

| | | | |
|---|---|---|---|
| 4,500,915 A | 2/1985 | Koike et al. | |
| 4,513,313 A | 4/1985 | Kinoshita et al. | |
| 4,807,037 A | 2/1989 | Iesaka et al. | |
| 4,879,601 A | 11/1989 | Buck et al. | |
| 5,164,807 A | 11/1992 | Theuwissen | |
| 5,189,498 A | 2/1993 | Sakakibara | |
| 5,194,944 A | 3/1993 | Uchiyama et al. | |
| 5,216,489 A | 6/1993 | Yonemoto et al. | |
| 5,278,660 A * | 1/1994 | Sugiki | 348/305 |
| 5,486,859 A * | 1/1996 | Matsuda | 348/311 |
| 5,528,643 A | 6/1996 | Hynecek | |
| 5,652,622 A | 7/1997 | Hynecek | |
| 5,841,554 A * | 11/1998 | Hasegawa | 358/514 |
| 5,995,249 A | 11/1999 | Sato et al. | |
| 6,002,146 A | 12/1999 | Nakagawa et al. | |
| 6,462,779 B1 | 10/2002 | Philbrick | |
| 6,600,512 B1 * | 7/2003 | Kimura | 348/283 |
| 6,686,960 B2 | 2/2004 | Iizuka | |
| 6,781,628 B1 | 8/2004 | Yoshihara et al. | |
| 6,784,928 B1 * | 8/2004 | Sakurai et al. | 348/220.1 |
| 7,002,630 B1 | 2/2006 | Iizuka | |
| 7,315,329 B1 * | 1/2008 | Yoshihara | 348/311 |
| 2004/0150733 A1 * | 8/2004 | Nagayoshi et al. | 348/272 |
| 2005/0062868 A1 | 3/2005 | Shiiba et al. | |
| 2006/0125943 A1 | 6/2006 | Parks | |
| 2007/0139545 A1 | 6/2007 | Parks | |

FOREIGN PATENT DOCUMENTS

EP 0795909 A2 3/1997
JP 56-158577 12/1981

* cited by examiner

Primary Examiner — Lin Ye
Assistant Examiner — Mekonnen Dagnew
(74) Attorney, Agent, or Firm — Bingham McCutchen LLP

(57) ABSTRACT

An image sensor includes a plurality of pixels overlaid with a color filter pattern of at least two colors having the same color on every other pixel in one direction; three or more charge-coupled devices oriented parallel to the every other pixel color filter repeat pattern; a charge sensing amplifier at the output of at least two of the charge couple devices; each charge-coupled device having a first and a second gate; a CCD-to-CCD transfer gate connecting adjacent charge-coupled devices with the first gate being on one side of the CCD-to-CCD transfer gate and the second gate being on the opposite side of the CCD-to-CCD transfer gate; all CCD-to-CCD transfer gates are electrically connected together; all first gates are electrically connected; and all second gates are electrically connected.

14 Claims, 37 Drawing Sheets

TIME T3

MULTIPLE OUTPUT CHARGE-COUPLED DEVICES

FIELD OF THE INVENTION

The invention relates generally to the field of more than two horizontal charge-coupled devices for reading out an array of pixels, and in particular, for allowing multiple horizontal charge-coupled devices (CCDs) to read out full resolution images or reduced resolution images at video frame rates with pixel summing.

BACKGROUND OF THE INVENTION

U.S. Pat. Nos. 4,513,313; 5,164,807; 5,841,554; and US Patent Publication 2005/0062868 describe a multiple output horizontal charge-coupled device (HCCD) that distributes m columns of charge to m HCCD registers. Such an output structure does not separate the charge from a Bayer color filter pattern into one color per register. They require a striped color filter arrangement that is undesirable for good image quality. They also do not allow for horizontal summing of pixels for increased frame rate.

The present invention will allow use of the Bayer color filter pattern and will allow for horizontal summing of pixels within the HCCD.

U.S. Pat. Nos. 4,807,037 and 5,189,498 describe a multiple output HCCD that has the undesirable feature of requiring the second HCCD to have a different channel doping level than the first HCCD. The extra doping requires more processing steps and mask levels.

The present invention will not require the extra doping in the second HCCD.

U.S. Pat. Nos. 5,216,489 and 6,002,146 describe a multiple output HCCD that requires the transfer gate between the two HCCDs to have more than two voltage levels. This is a more complex HCCD clock driver that requires more components. Horizontal summing of pixels within the HCCD is also not disclosed.

The present invention only requires two clock levels and those two levels will be used for all HCCD clocks.

U.S. Pat. No. 5,995,249 illustrates a multiple output HCCD but provides no information about its construction or timing signals. It also does not disclose horizontal summing of pixels within the HCCD for a faster frame rate.

U.S. Pat. No. 6,781,628 describes a multiple output HCCD but does not disclose horizontal summing of pixels within the HCCD for a faster frame rate. It also requires separate control gates between the HCCD and the pixel array for even and odd columns.

The present invention does not require even and odd columns to have separate control gates between the pixel array and HCCD.

SUMMARY OF THE INVENTION

The present invention is directed to overcoming one or more of the problems set forth above. Briefly summarized, according to one aspect of the present invention, the present invention resides in an image sensor comprising a plurality of pixels overlaid with a color filter pattern of at least two colors having the same color on every other pixel in one direction; three or more charge-coupled devices oriented parallel to the every other pixel color filter repeat pattern; a charge sensing amplifier at the output of at least two of the charge couple devices; each charge-coupled device having a first and a second gate; a CCD-to-CCD transfer gate connecting adjacent charge-coupled devices with the first gate being on one side of the CCD-to-CCD transfer gate and the second gate being on the opposite side of the CCD-to-CCD transfer gate; all CCD-to-CCD transfer gates are electrically connected together; all first gates are electrically connected; and all second gates are electrically connected.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages of reading out a full resolution image or a reduced resolution higher frame rate image with pixel summing using multiple horizontal charge-coupled devices and no more than three or four horizontal clock drivers.

DETAILED DESCRIPTION OF THE INVENTION

The invention has been described with reference to a preferred embodiment. However, it will be appreciated that a person of ordinary skill in the art can effect variations and modifications without departing from the scope of the invention.

Figure 1A:
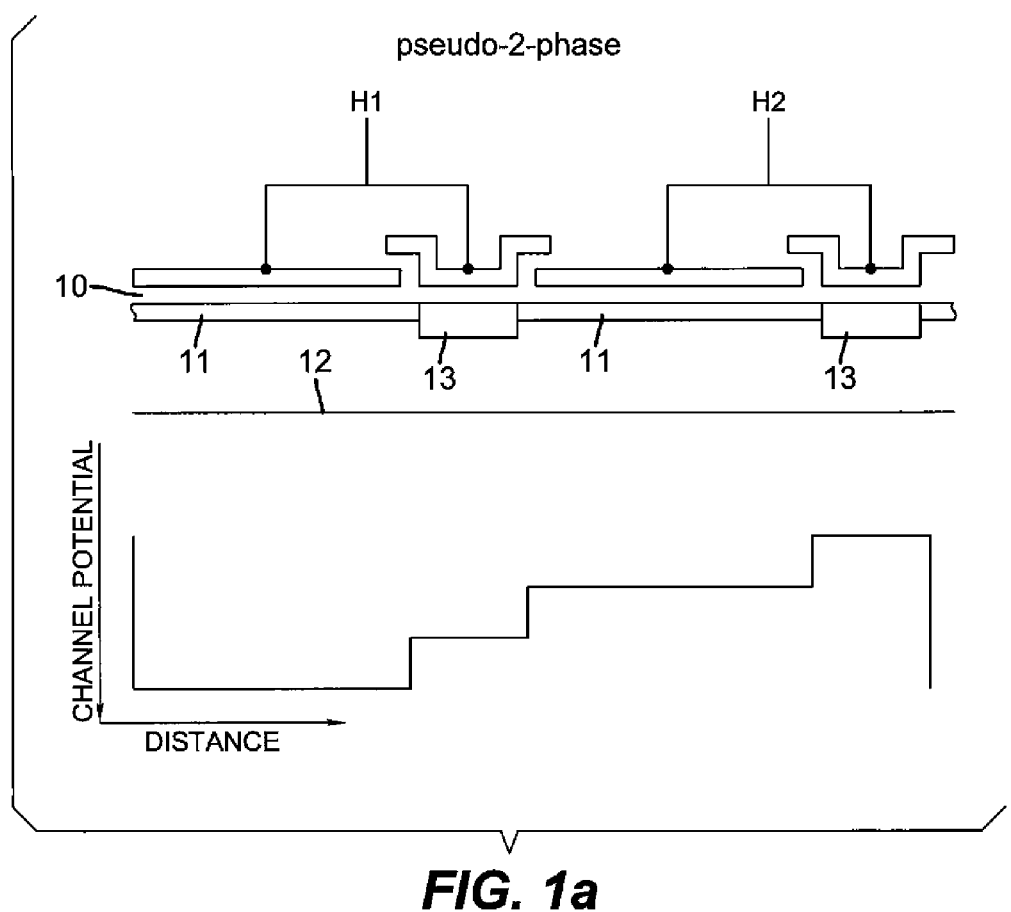
FIG. 1a is a diagram of a pseudo-2-phase CCD.
Figure 1B:
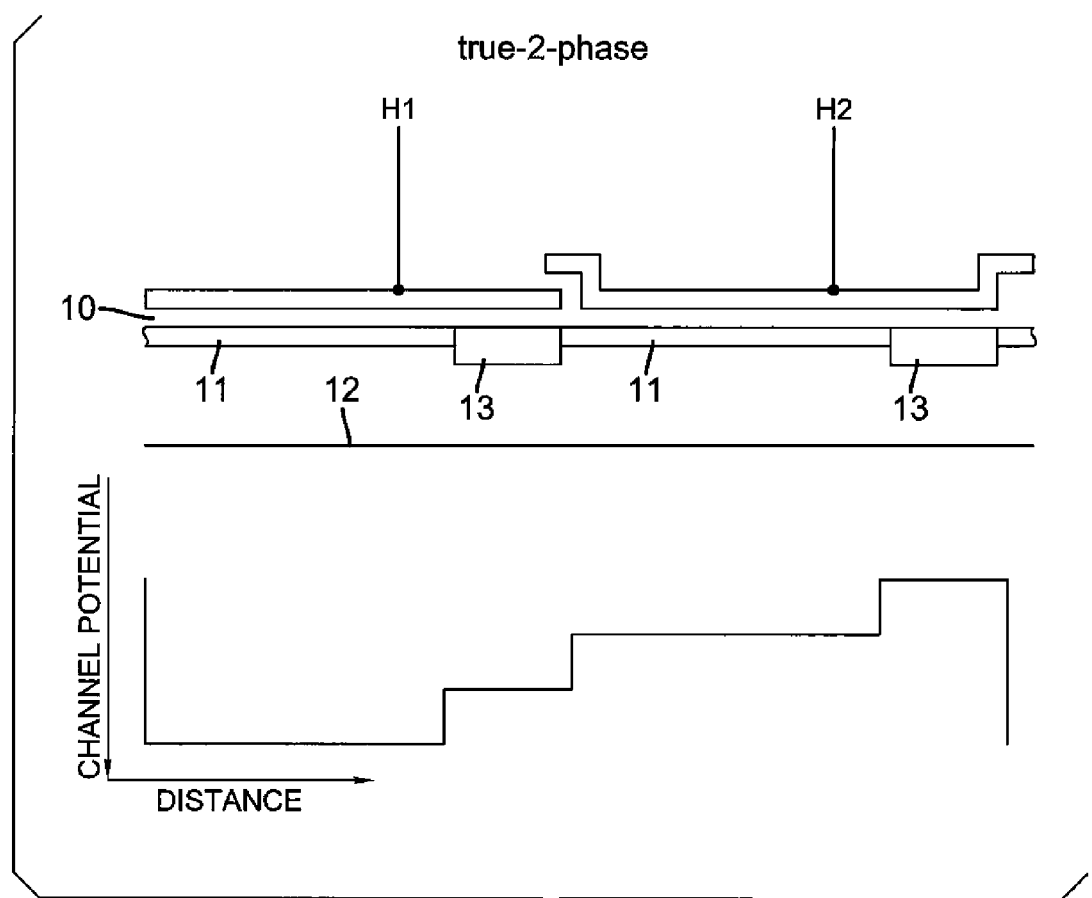
FIG. 1b is a diagram of a true-2-phase CCD.

The definition of a CCD shift register gate is either of the true 2-phase type or pseudo-2-phase type. FIGS. 1a and 1b show the difference between the two types of 2-phase CCDs. Each shift register gate has an H1 and H2 gate on an insulator 10. The CCD buried channel 11 of a first conductivity type (typically n-type) on a well or substrate 12 of a second conductivity type (typically p-type). There are also channel potential barrier implants 13 to control the direction of charge transfer. Throughout this detailed description of the invention, a part identified as a gate may be of either the true-2-phase or pseudo-2-phase type.

Figure 2:
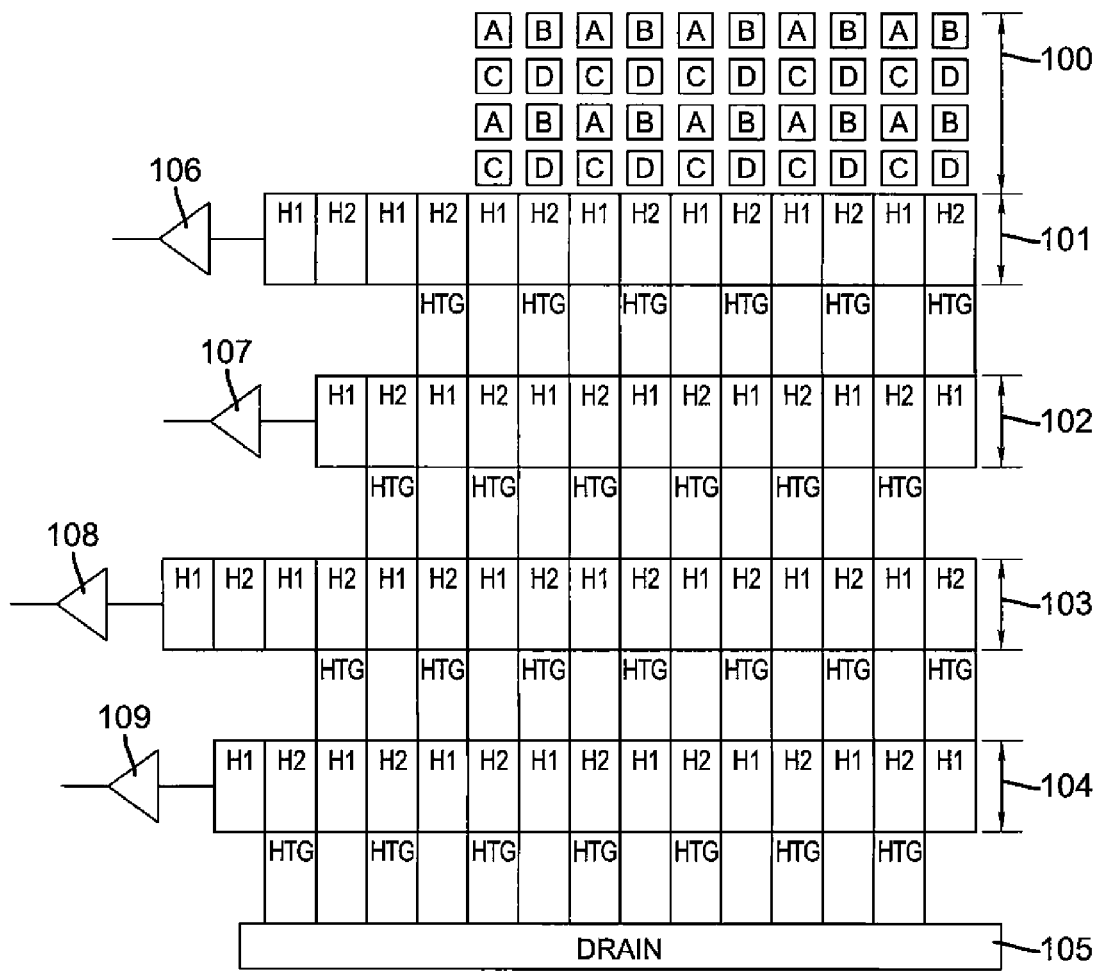
FIG. 2 is a HCCD showing one implementation of the first embodiment of the present invention having four CCDs.

The first embodiment of the present invention is shown in FIG. 2. It is an image sensor with a plurality of pixels 100 of colors A, B, C, and D. The colors are typically, but not limited to, the Bayer color filter pattern where A and D are green, B is blue, and C is red. There are more than two horizontal charge-coupled devices (HCCD) 101, 102, 103, and 104. The present invention is not limited to only four HCCDs, more than four is an extension of the example shown in FIG. 2, as will be apparent to those skilled in the art. Each HCCD is driven by the same two clock signals H1 and H2. The gates H1, and H2 alternate with one gate per column of the pixel array. Each gate H1 or H2 may be a true-2-phase CCD gate or a pseudo-2-phase CCD gate. When the H1 and H2 gates are clocked in a complimentary manner, charge in all of the HCCDs are shifted towards the charge sensing output amplifiers 106, 107, 108, and 109 at the end of each HCCD. Between each HCCD is a transfer gate HTG that allows charge to transfer between adjacent HCCDs. Each HTG is also either a true-2-phase CCD gate or a pseudo-2-phase CCD gate. The HTG is constructed such that it is able to hold under the HTG gate an entire charge packet from the H2 gates. An alternate and equivalent design would be to place the HTG gate to receive charge from the H1 gates.

Below the last HCCD 104 is a fast charge dump drain 105 coupled to the last HCCD 104 by a transfer gate HTG. This allows an entire row of charge from the pixel array 100 to be rapidly discarded to the drain instead of being clocked out of the HCCDs.

Figure 3:
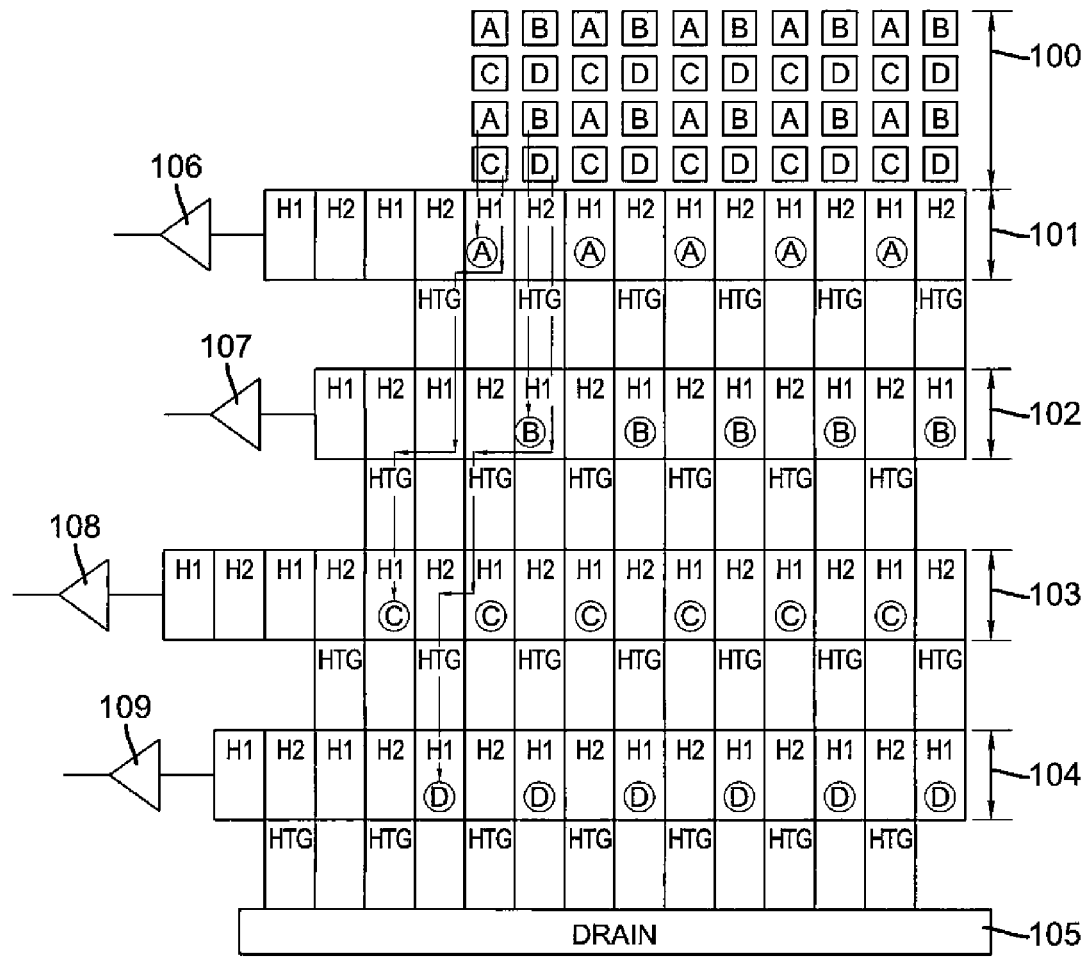
FIG. 3 shows the path of charge for transferring two rows of charge from the pixel array into the HCCD of the first embodiment.

The advantage of this HCCD structure is it only requires two high frequency clocking signals H1 and H2, and one low frequency clocking signal HTG. FIG. 3 shows how the charge packets flow from the pixel array 100 to each one of the four HCCDs 101, 102, 103, and 104. Two rows of charge from the pixel array 100 are distributed between the four HCCDs. From the first row, color D goes to HCCD 104 and color C goes to HCCD 103. From the next row, color B goes to HCCD 102 and color A goes to HCCD 101. Note that each HCCD contains only one color. It is advantageous for each HCCD to contain one color because the output amplifier electronics gain can be adjusted differently for each color. Also, on each clock cycle of H1 and H2, one entire 2×2 pixel kernel is sampled at the output amplifiers 106, 107, 108, and 109 simultaneously.

Figure 4:
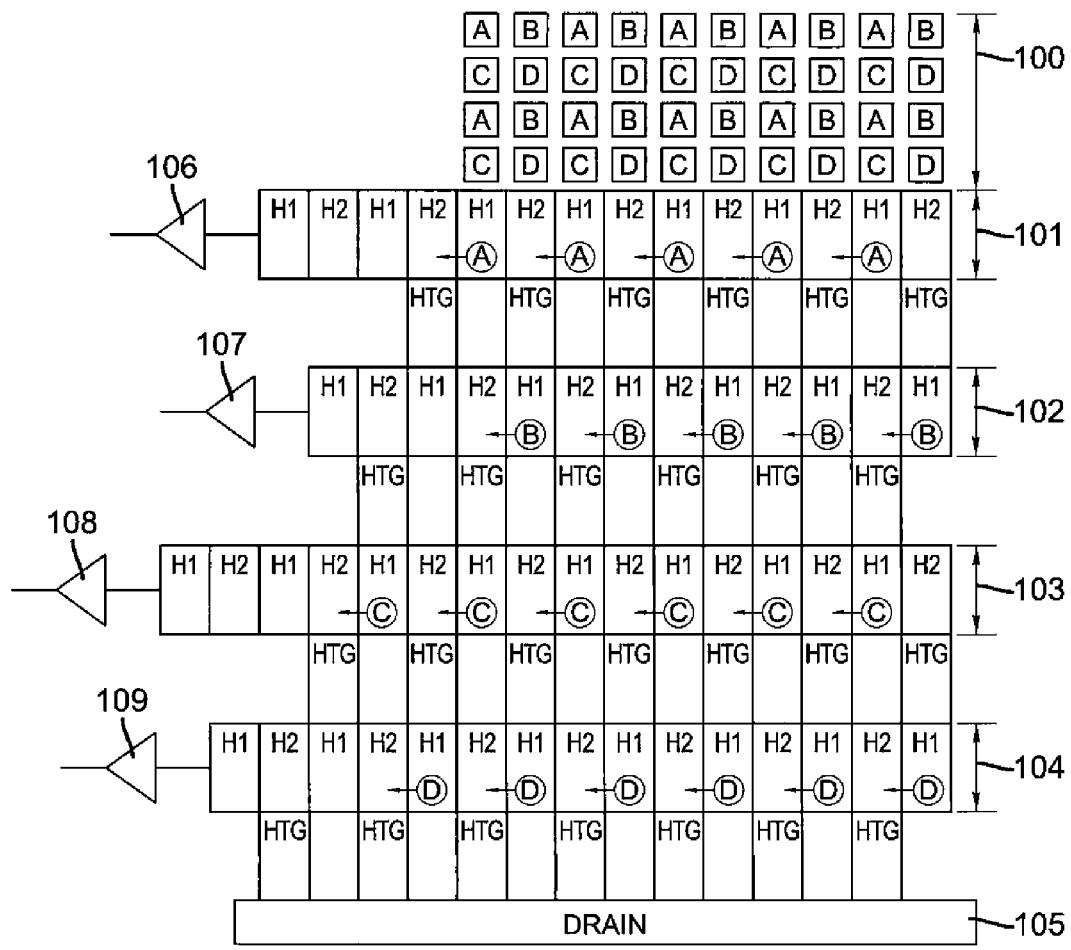
FIG. 4 shows the read out of charge in the HCCD of the first embodiment.
Figure 5:
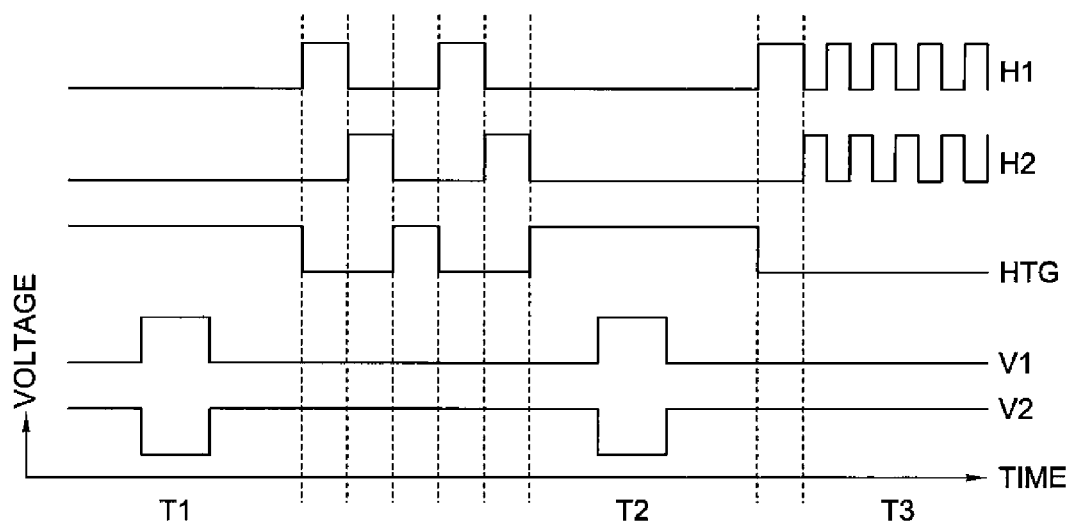
FIG. 5 shows the clock driver timing diagram for the transfer of charge in FIG. 4.

Once the two rows of charge have been transferred into their respective HCCD, the H1 and H2 clocks then clock at high frequency in a complimentary manner to shift charge towards the output amplifiers 106, 107, 108, and 109, as shown in FIG. 4. The timing diagram for shifting charge is shown in FIG. 5. The V1 and V2 clock lines are for a two-phase pixel array vertical CCD timing. The present invention is not limited to two phase VCCDs; three or more phase VCCDs may be used. VCCDs that employ interlaced readout or charge summing may also be used.

At time T1 in FIG. 5, a first row of charge is transferred from the pixel array 100 into HCCDs 101 and 102. The times between T1 and T2 correspond to FIG. 3 where the first row of charge is shifted from HCCDs 101 and 102 down into HCCDs 103 and 104. At time T2 a second row of charge is transferred from the pixel array 100 into HCCDs 101 and 102. Now the four HCCDs are full of charge and at time T3 the HCCD begins clocking charge towards the output amplifiers corresponding to FIG. 4.

The second embodiment of the present invention pertains to operating the HCCD in a faster readout mode. Digital cameras are now required to take high-resolution single shot photographs and also lower resolution 30 frames/second video. This second embodiment shows how the first embodiment may be modified to sum two pixels horizontally in the HCCD to double the readout rate of each HCCD.

Figure 6:
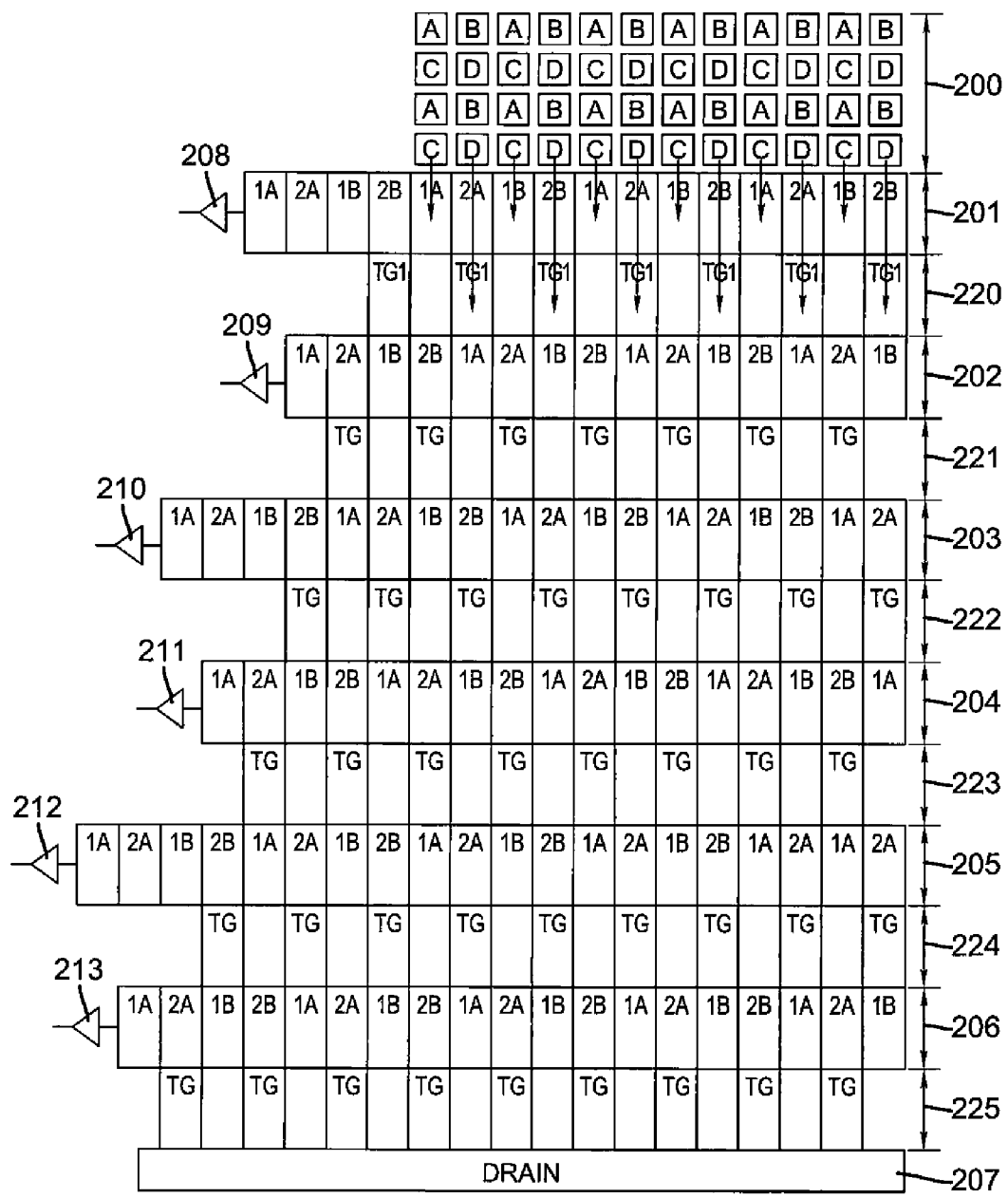
FIG. 6 is a HCCD showing one implementation of the second embodiment of the present invention having six CCDs.

FIG. 6 shows the second embodiment of the present invention. Each HCCD 201, 202, 203, 204, 205, and 206 has four control gates, 1A, 2A, 1B, and 2B for shifting charge along each HCCD towards the charge sensing output amplifiers 208, 209, 210, 211, 212, and 213. There are six HCCDs shown with transfer gates TG and TG1 controlling the transfer of charge between the HCCDs. The TG1 transfer gate is only between HCCDs 201 and 202 in the region 220. The remaining TG transfer gates are all electrically connected together and located in the regions 221, 222, 223, and 224. There is also a gate electrically connected to TG in region 225 for transferring charge to the fast charge dump drain 207. The second embodiment of the present invention is functionally equivalent to a six output version of the first embodiment in FIG. 2 if the gates 1A and 1B in FIG. 6 are connected together as well as gates 2A and 2B and also gates TG1 and TG. Thus when in full resolution single shot photography mode the HCCD still only requires two high frequency clock signals and one low frequency transfer gate clock signal.

The half resolution double speed video readout mode of the second embodiment is now described. The process begins with FIG. 6 where a first row is transferred from the pixel array 200 into the top two HCCDs. Color C enters the 1A and 1B gates of HCCD 201 and color D passes through the 2A and 2B gates of HCCD 201 and into the TG1 gate.

Figure 7:
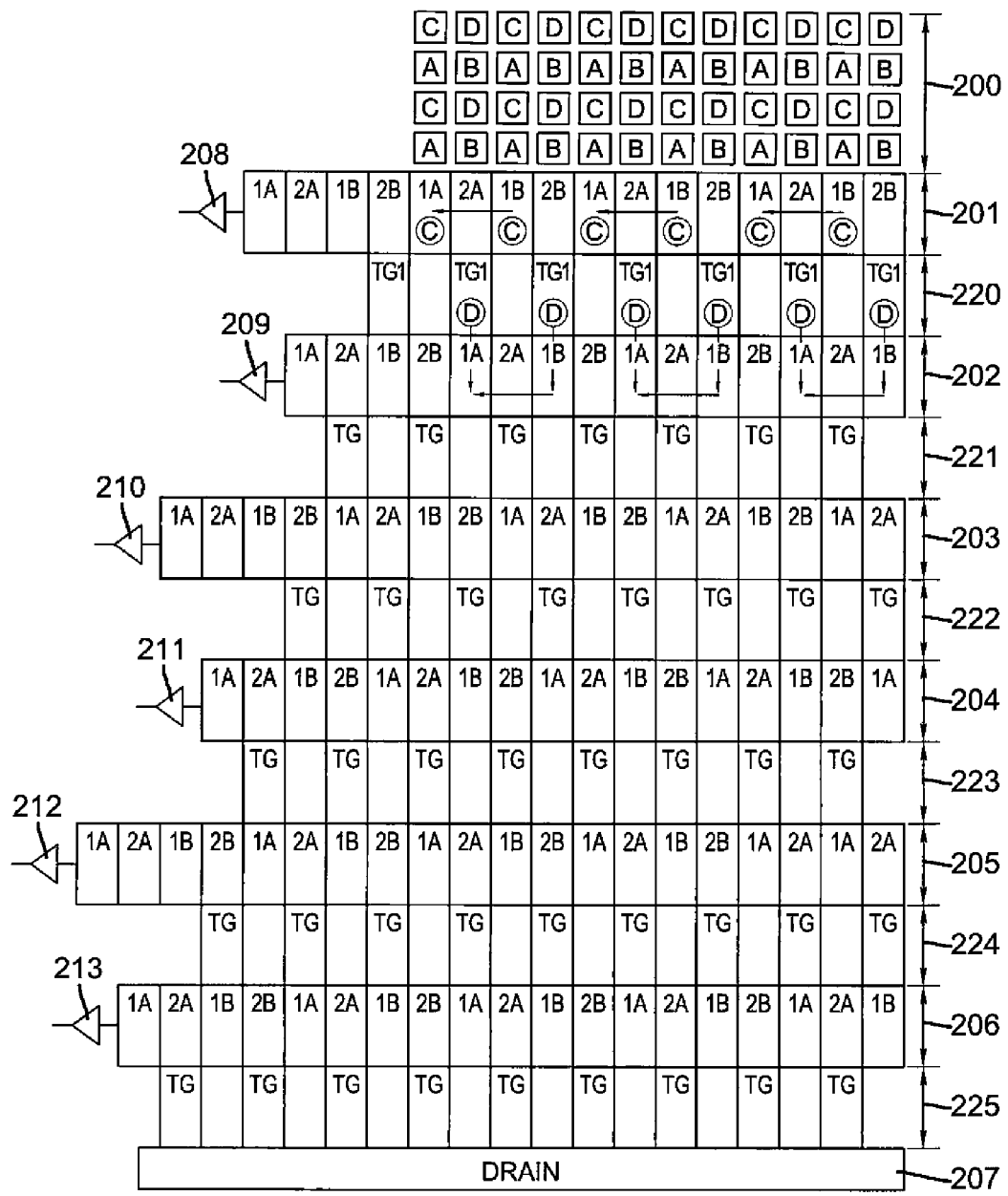
FIG. 7 shows where the charge packets are at time step T1.
Figure 8:
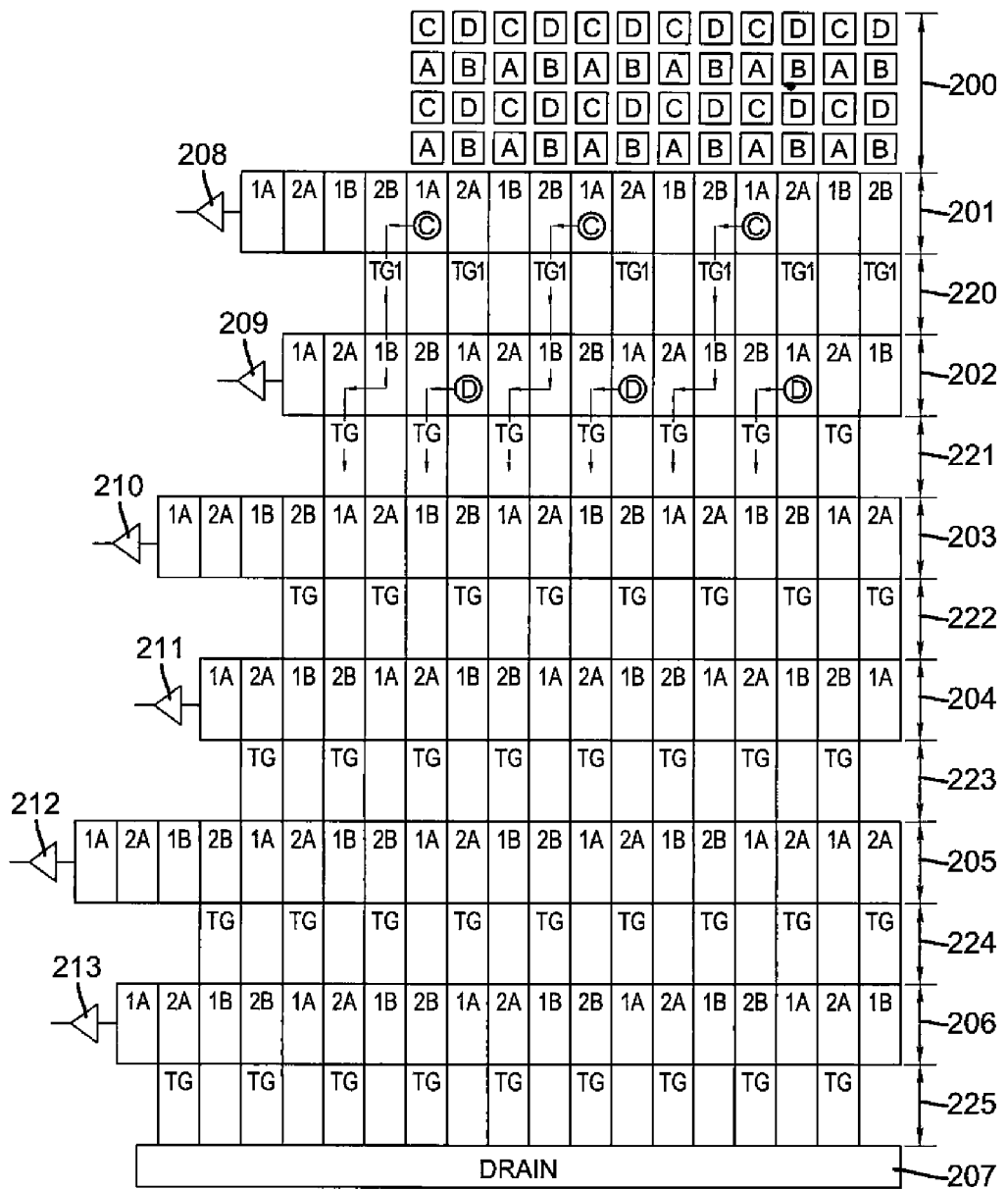
FIG. 8 shows where the charge packets are at time step T2.

The next step is shown in FIG. 7. The color charge packet C under the 1B gate in HCCD 201 advances forward two gates while the color charge packet C under the 1A gate remains stationary. This will sum together the two color charge packets C. The same process takes place in HCCD 202 after the color D charge packets are transferred out of the TG1 gate into HCCD 202. FIG. 8 shows the result of the charge summing. The double circle around the charge packets C and D indicates they represent the sum of two charge packets.

Figure 9:
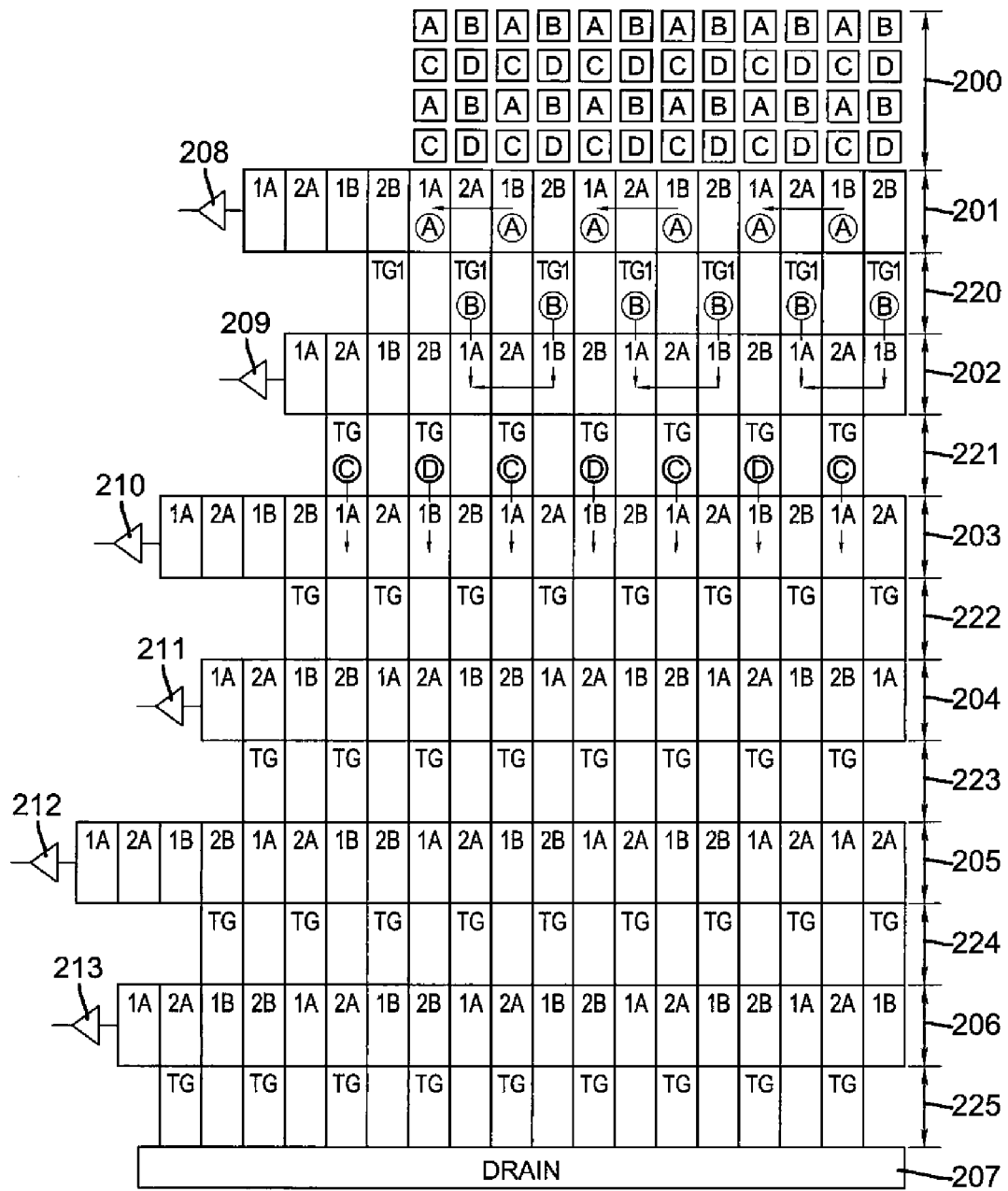
FIG. 9 shows where the charge packets are at time step T3.

Next, the color D charge packets are transferred under the TG gates in region 221 and held there while the color C charge packets are transferred through the TG1 gates and HCCD 202. Since the color D charge packets have been summed, there are empty TG gates in region 221. These empty TG gates are filled by the summed color C charge packets, as shown in FIG. 9. At the same time, the next row of pixels from the pixel array 200 is transferred into HCCD 201 and TG1 220.

Figure 10:
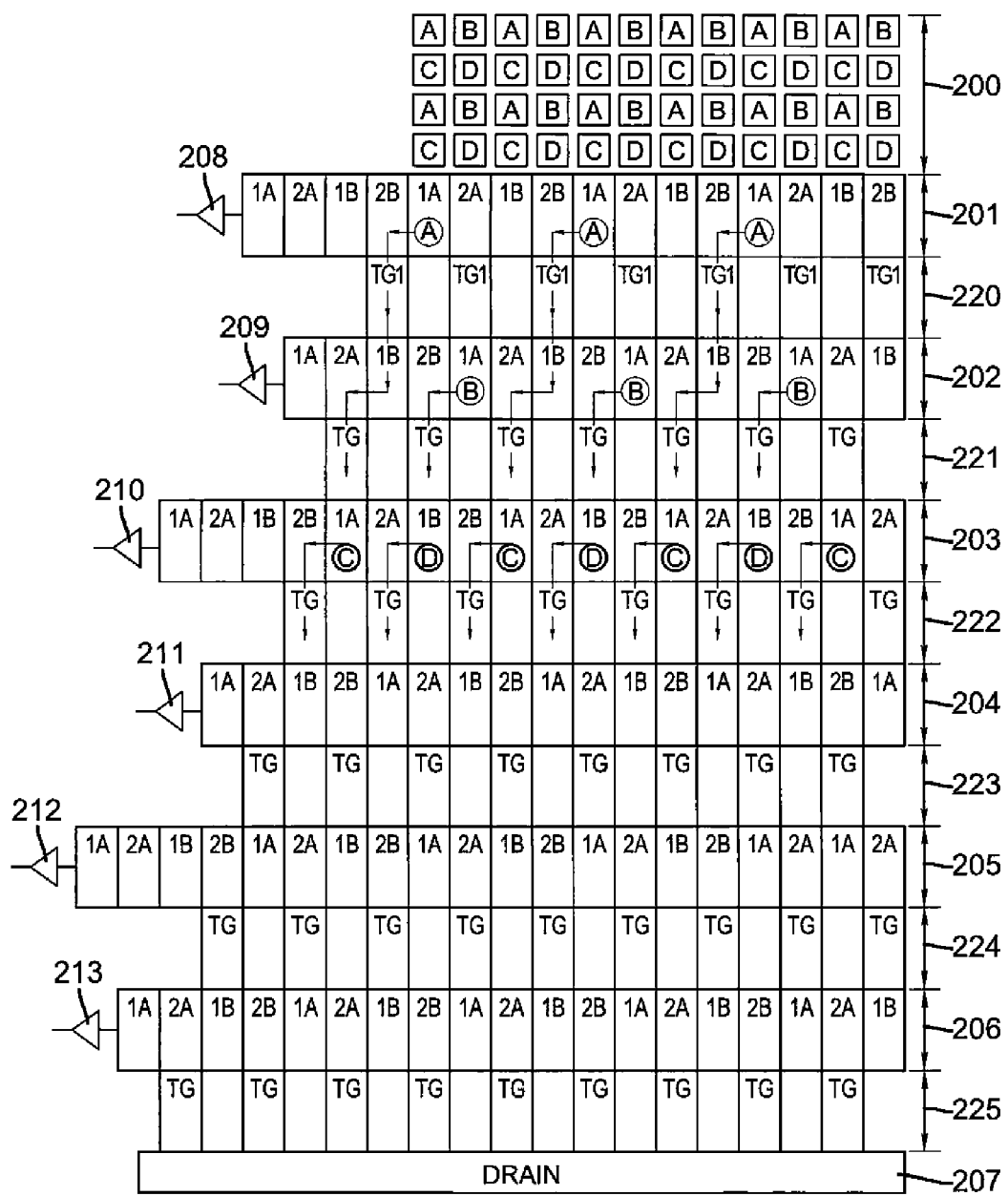
FIG. 10 shows where the charge packets are at time step T4.

Next, two color A and B charge packets are summed together in the HCCDs 201 and 202 while the already summed color C and D charge packets are transferred towards the next TG region 222 as shown in FIG. 10.

Figure 11:
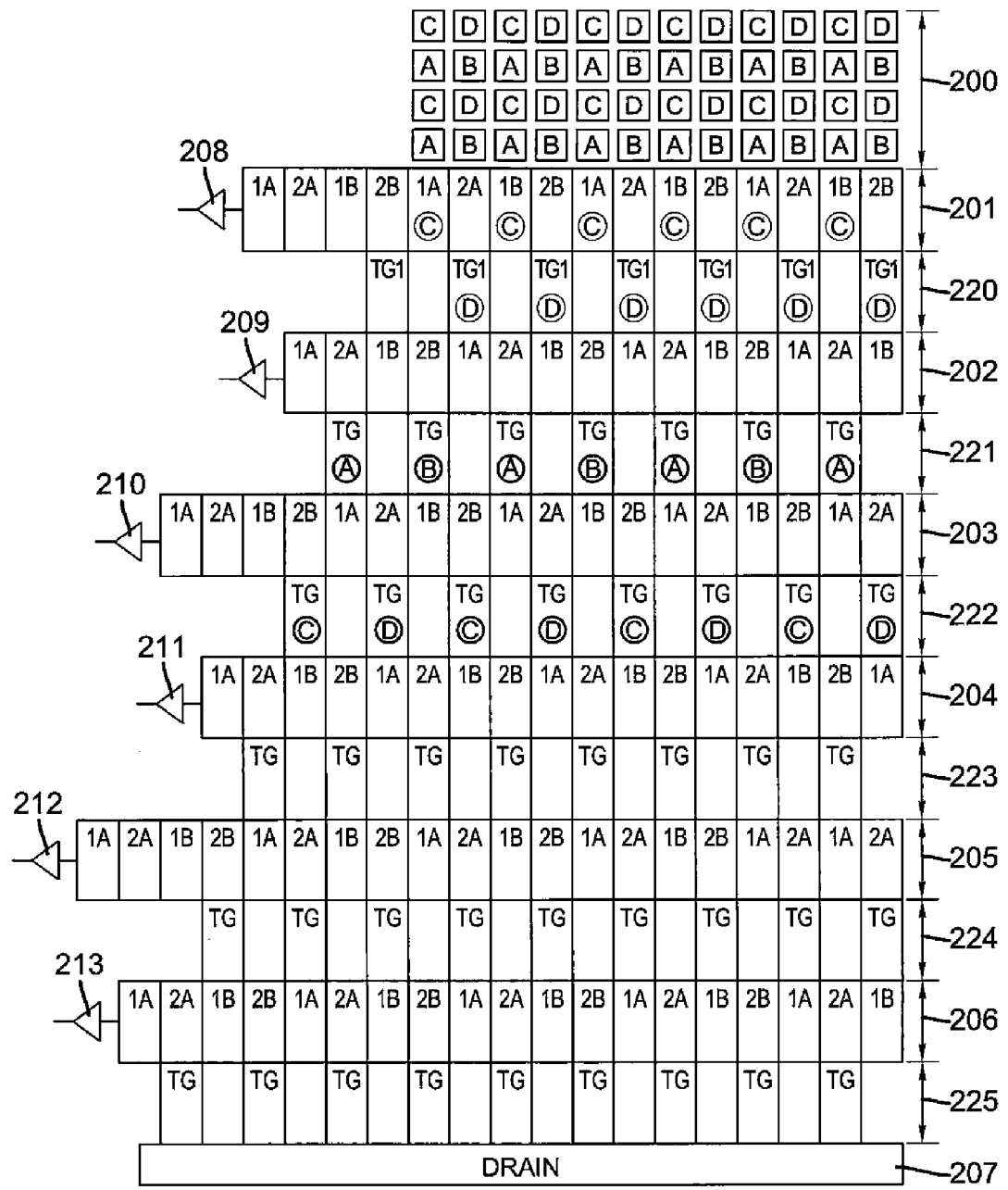
FIG. 11 shows where the charge packets are at time step T5.

In FIG. 11, while the summed color A, B, C, and D charge packets are held under TG gates 221 and 222, another row of colors C and D are transferred from the pixel array 200 into the HCCD 201 and TG1 220.

This process of summing together two charge packets of the same color repeats until the bottom four HCCDs 203, 204, 205, and 206 are filled with charge. Now the HCCDs contain four entire rows of charge from the pixel array 200. HCCDs 201 and 202 are empty. If the HCCDs are read out, amplifiers 208 and 209 can be turned off to conserve power. With this summing process four rows and four outputs are read out instead of only three rows and six outputs as with the full resolution readout mode.

Figure 12:
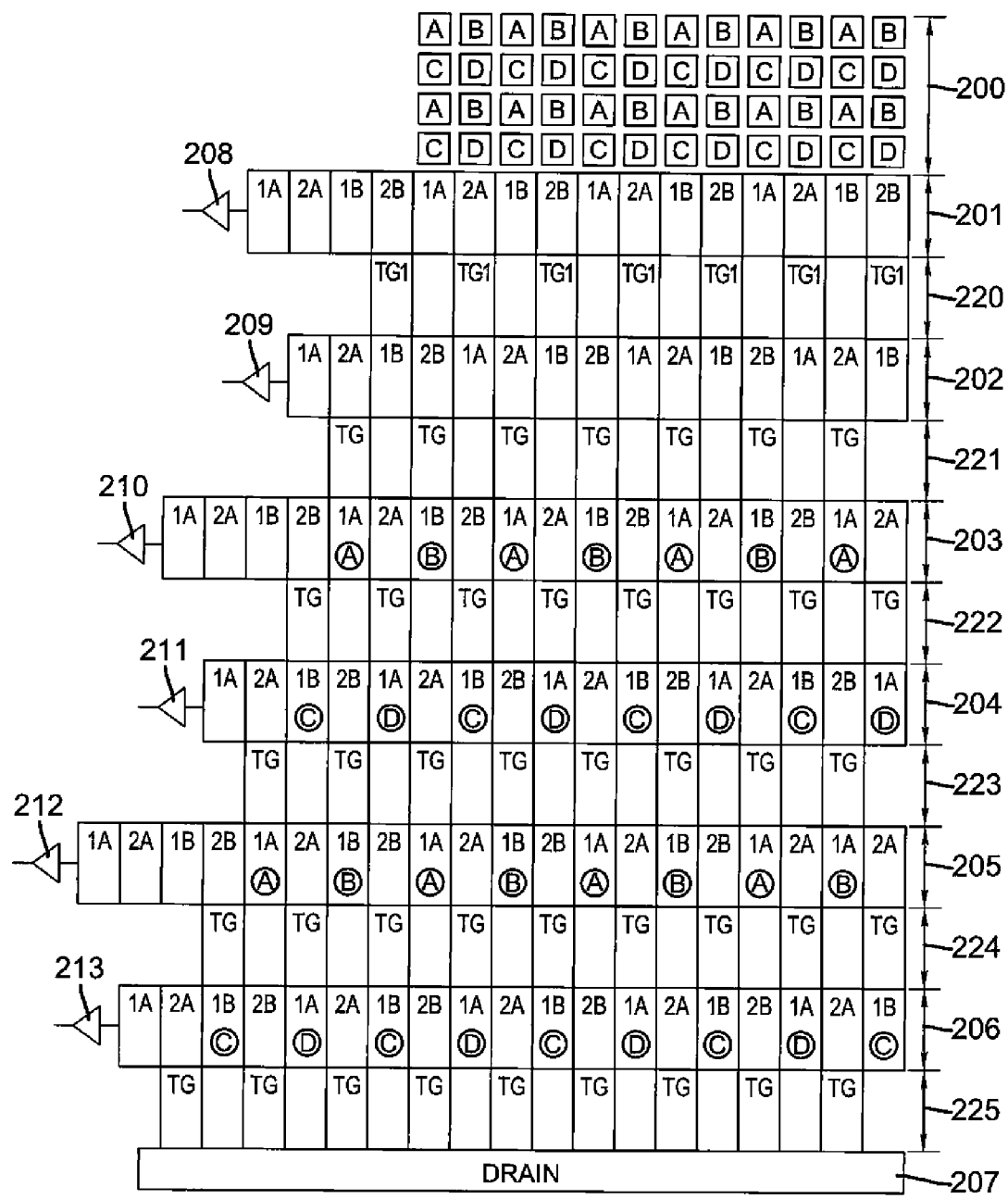
FIG. 12 shows where the charge packets are at time step T6.
Figure 14:
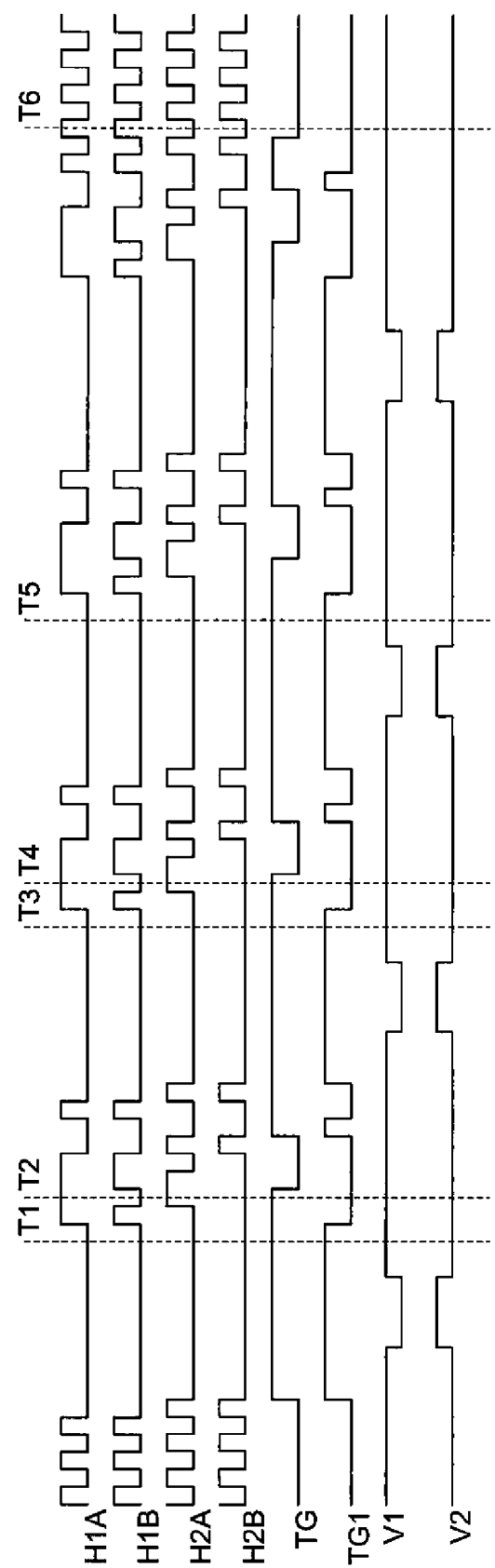
FIG. 14 shows the clock driver timing diagram for transfer of charge in FIGS. 7 through 12.

FIG. 14 shows the timing sequence to transfer four rows of charge into the HCCDs. FIG. 7 shows where the charge packets are at time T1, FIG. 8 at time T2, FIG. 9 at time T3, FIG. 10 at time T4, FIG. 11 at time T5, and FIG. 12 at time T6. The V1 and V2 clock signals in FIG. 14 are only shown to indicate at what time a new row of charge packets are transferred from the pixel array 200. V1 and V2 are shown as 2-phase CCD clocking only as one example of many types of VCCD clocking that may be used. 3-phase, 4-phase or more VCCD clocking may be used. The VCCD may also be a multi-field interlaced readout, or have vertical pixel summing capabilities.

Figure 13:
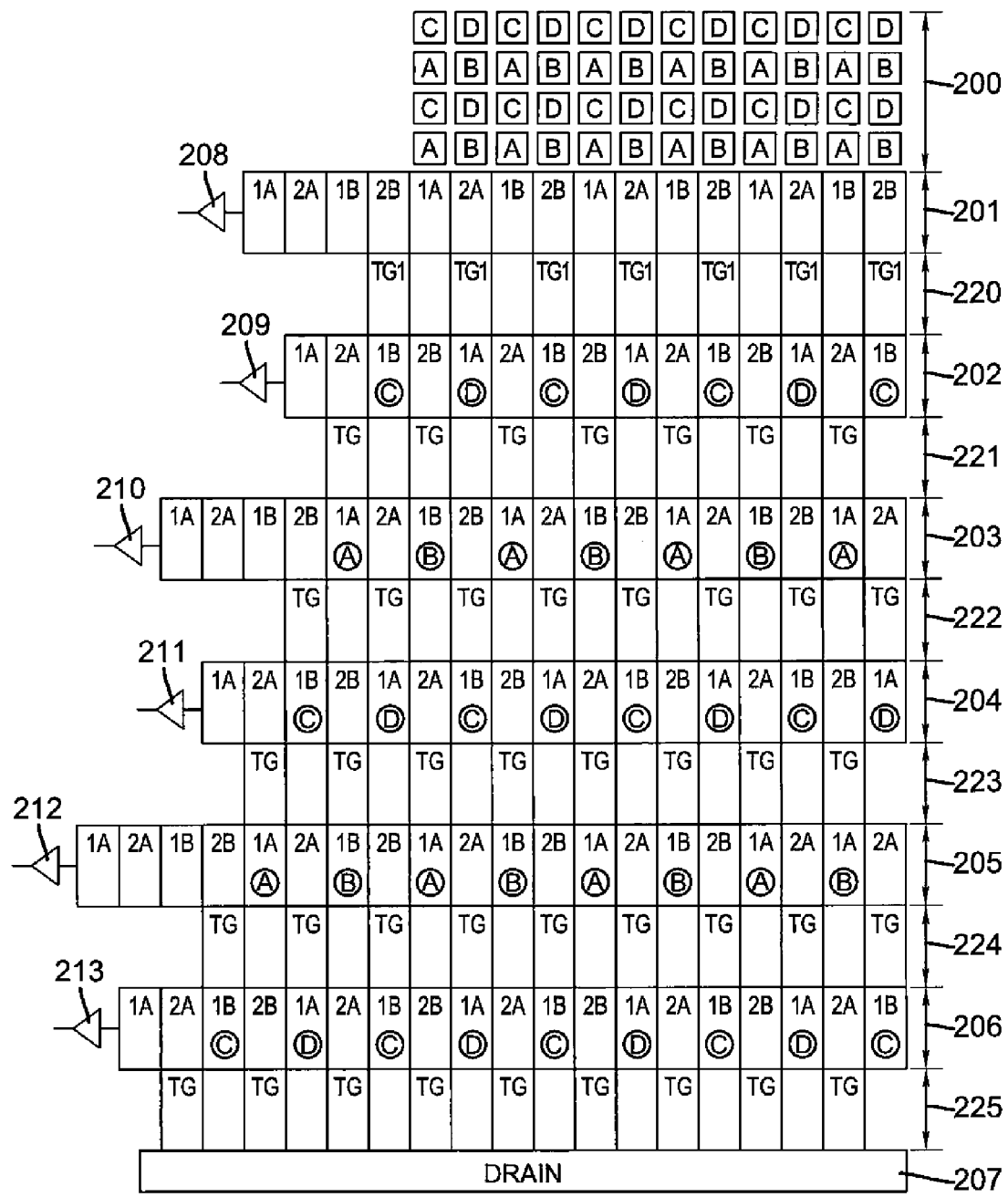
FIG. 13 shows where the charge packets are at time step T7.
Figure 15:
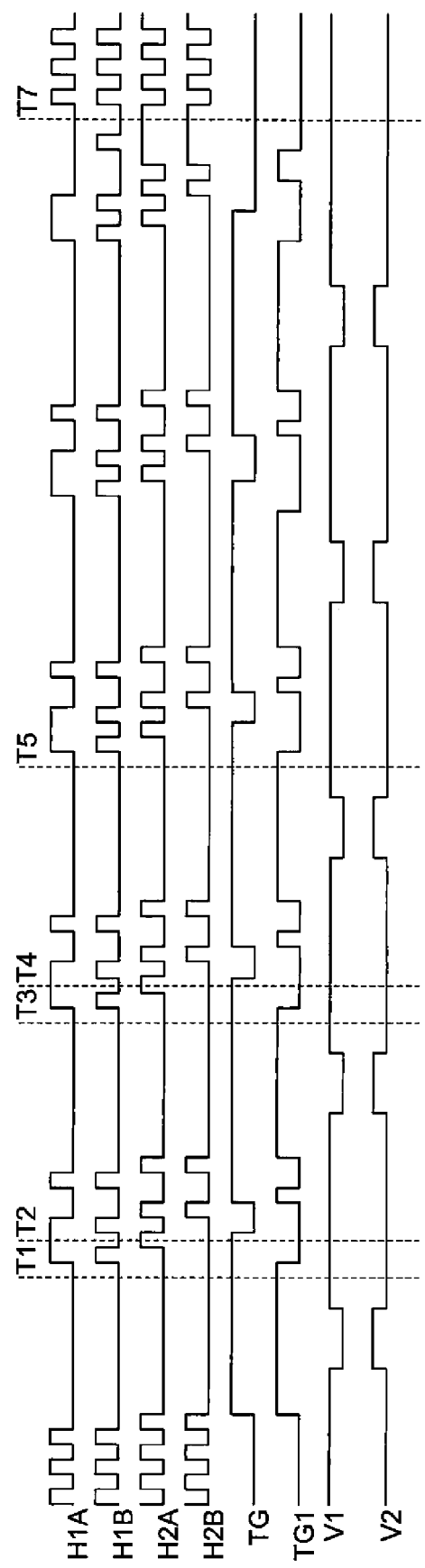
FIG. 15 shows the clock driver timing diagram for transfer of charge in FIGS. 7 through 13.

The second embodiment of the present invention is not limited to only four rows of simultaneous readout. FIG. 13 shows one more step of pixel summing to place a 5$^{th}$ row of charge into HCCD 202. Now only HCCD 201 is empty. Five rows of charge can be read out of the HCCDs at ½ resolution in the same time it takes three rows of charge to be read out at full resolution. FIG. 15 shows the timing diagram for reading out five rows of charge at ½ resolution. Time step T7 corresponds to FIG. 13.

Figure 16:
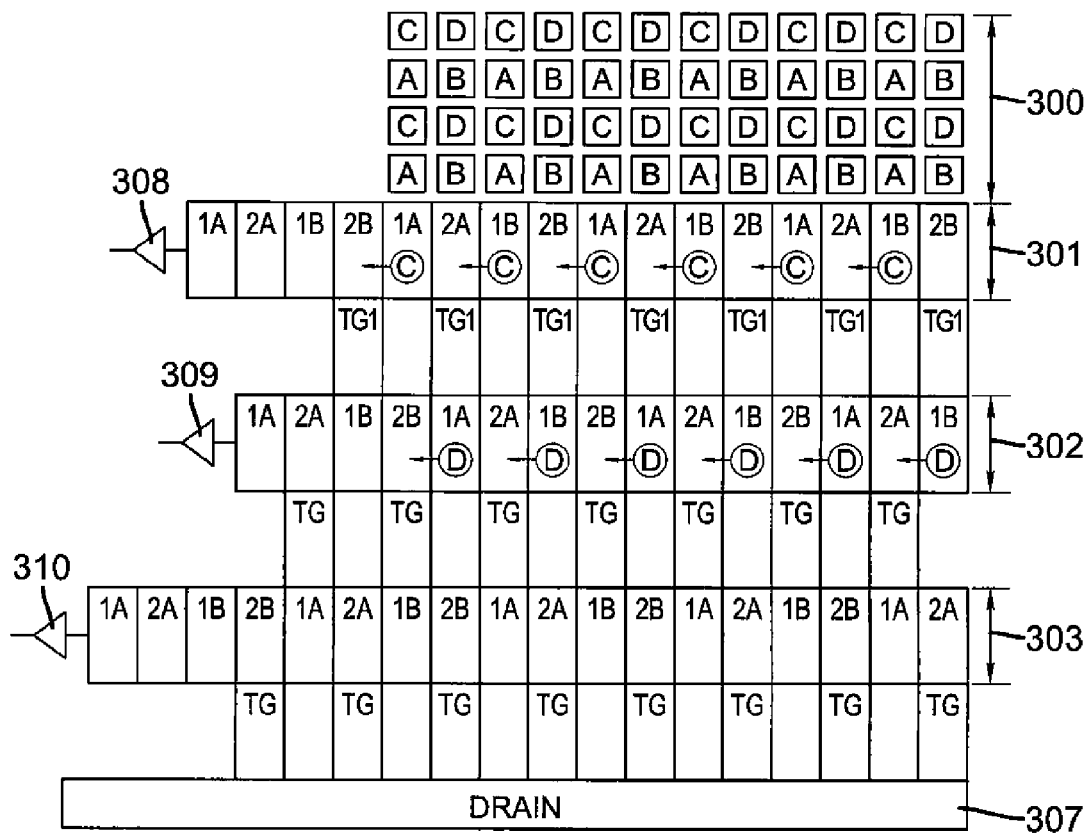
FIG. 16 shows a HCCD with three CCDs of the second embodiment for full resolution readout.
Figure 17:
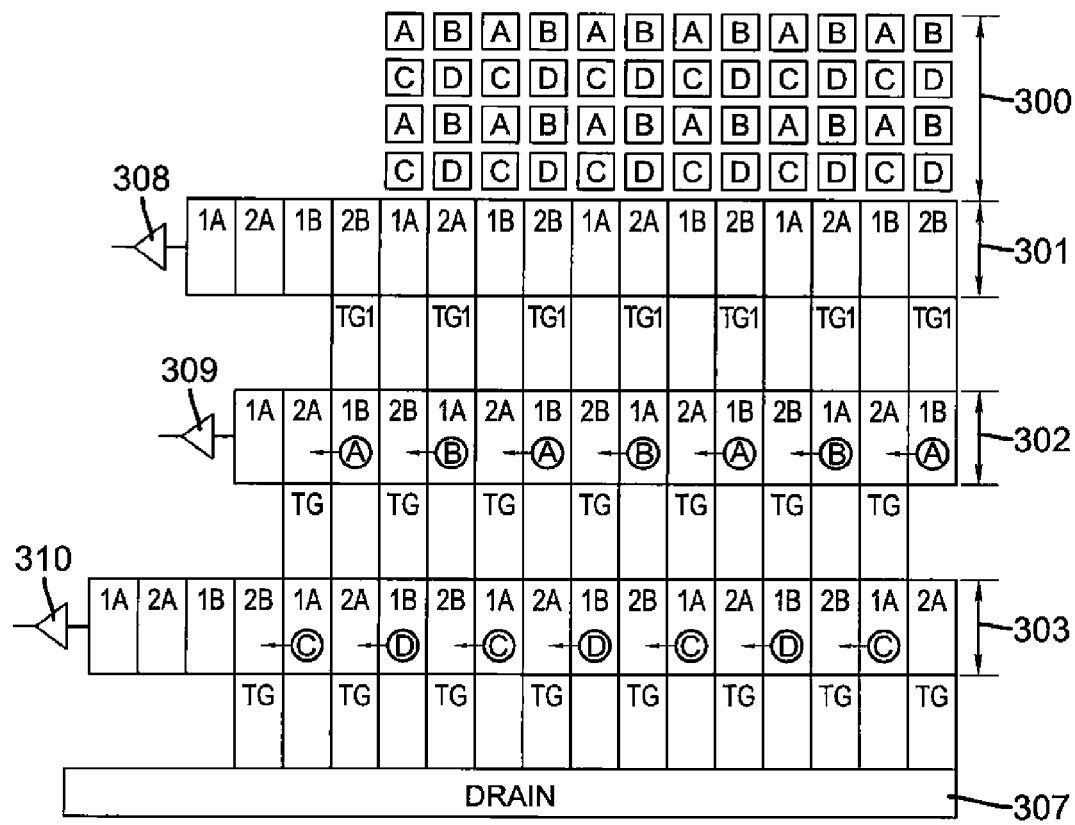
FIG. 17 shows a HCCD with three CCDs of the second embodiment for two-pixel summing readout.

There are many equivalent variations of the second embodiment with a different number of HCCD registers. For example, one variation would be to have three HCCD shift registers as shown in FIG. 16. The fast charge dump drain 307 is used to quickly dump entire rows of charge for sub-windowing modes or for flushing the VCCD of excess charge. For full resolution readout, the first two HCCDs 301 and 302 would be used to read out one row at a time from the pixel array 300. Only amplifiers 308 and 309 would be powered for full resolution readout. In half resolution double speed read out mode double summed charge packets would be read out of HCCDs 302 and 303 as shown in FIG. 17. Only amplifiers 309 and 310 would be powered in half resolution double speed mode. The HCCD registers 302 and 303 contain two rows of charge to double the amount of charge read out per HCCD.

The amplifier 308 may be omitted entirely from the image sensor if in FIG. 16 the charge packets in registers 301 and 302 are shifted down to registers 302 and 303 and then read out of amplifiers 309 and 310. This example using three HCCD registers shows the invention's HCCD structure is not limited to only an even number of HCCD registers.

The third embodiment of the invention shows how three horizontal pixels of the same color may be summed together within the HCCD. This provides for a ⅓$^{rd}$ resolution image readout at video frame rates.

Figure 18:
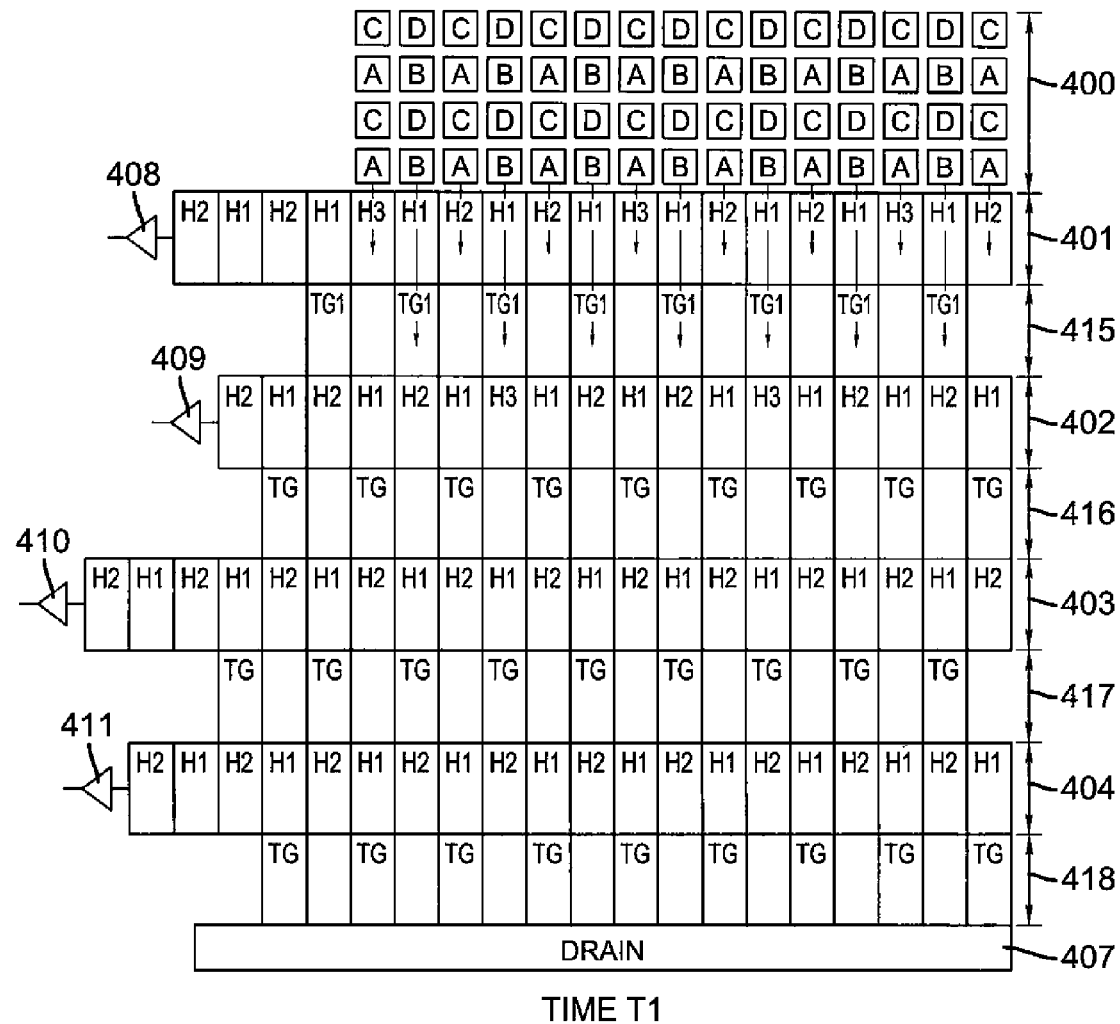
FIG. 18 shows the location of charge at time T1 of the third embodiment of the present invention.

FIG. 18 shows a third embodiment. It is an image sensor with a plurality of pixels 400 of colors A, B, C, and D. The colors are typically, but not limited to, the Bayer color filter pattern where A and D are green, B is blue, and C is red. It may also be a single color device where A, B, C, and D are all the same color or of no color (pan-chromatic). There are four HCCD shift registers 401, 402, 403, and 404 with charge sensing output amplifiers 408, 409, 410, and 411. The first two HCCD shift registers 401 and 402 have three gates H1, H2, and H3. The H1 and H2 gates alternate with every sixth gate being and H3 gate. All gates labeled H1 are connected together. All gates labeled H2 are connected together. All gates labeled H3 are connected together. The other two HCCD shift registers 403 and 404 in this example only have the H1 and H2 gates. An equivalent variation would be if every sixth gate of HCCD shift registers 403 and 404 are an H3 gate just like the HCCDs 401 and 402.

In between HCCD 401 and 402 is a transfer gate TG1 in region 415 for transfer of charge from HCCD 401 to HCCD 402. The TG1 gate is capable of holding the same amount of charge as the H1, H2, and H3 gates. The TG gates in regions 416, 417 and 418 control the transfer of charge between the remaining HCCD shift registers and the fast charge dump drain 407.

Figure 19:
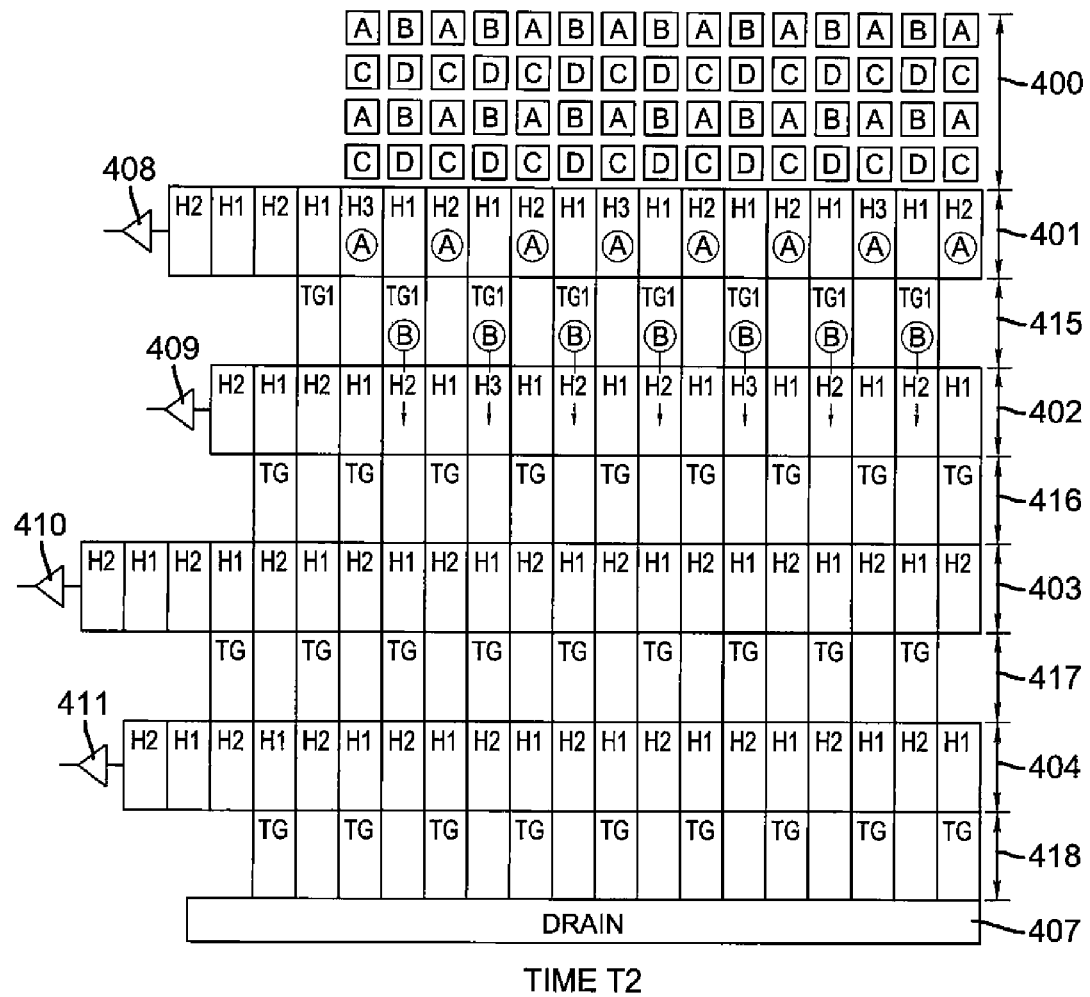
FIG. 19 shows the location of charge at time T2 of the third embodiment.
Figure 20:
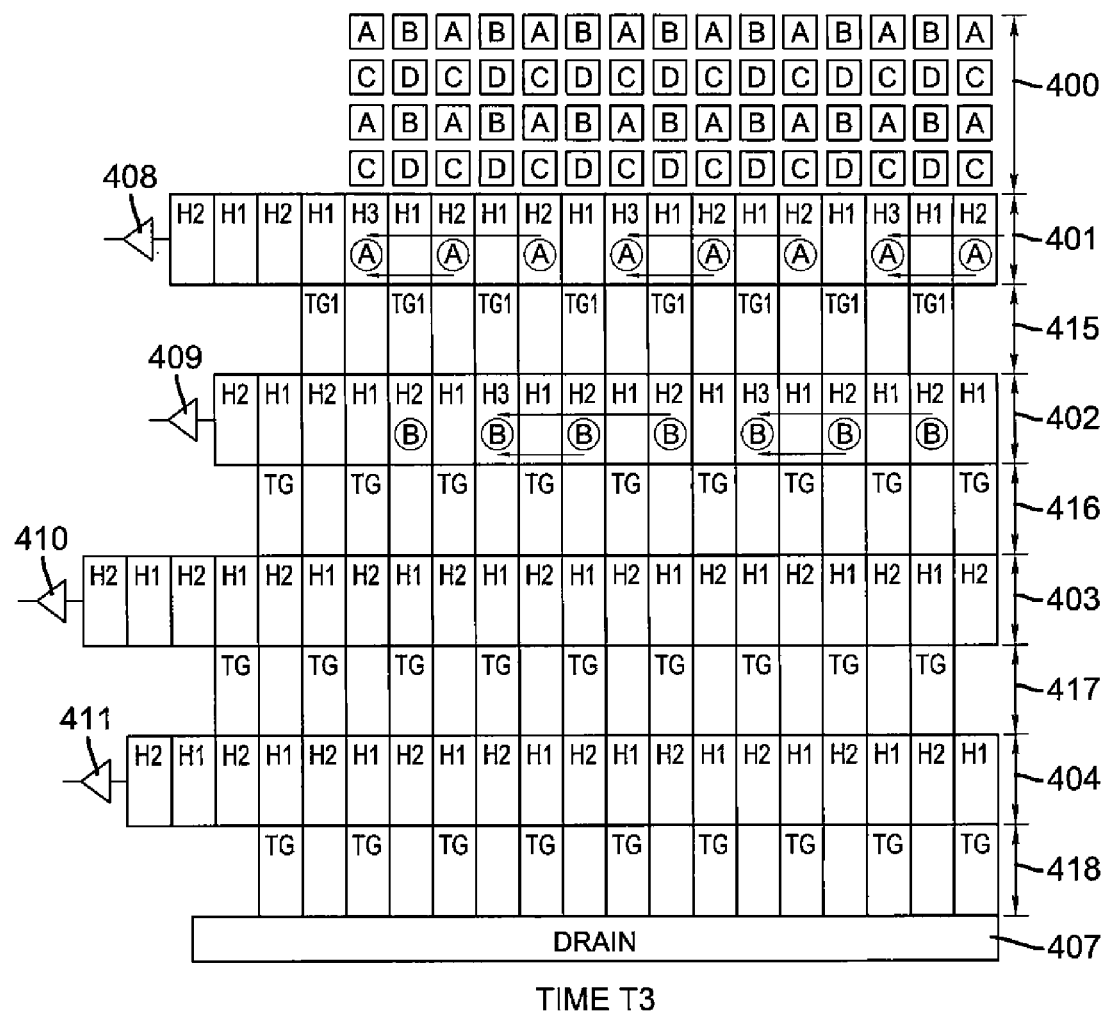
FIG. 20 shows the location of charge at time T3 of the third embodiment.
Figure 21:
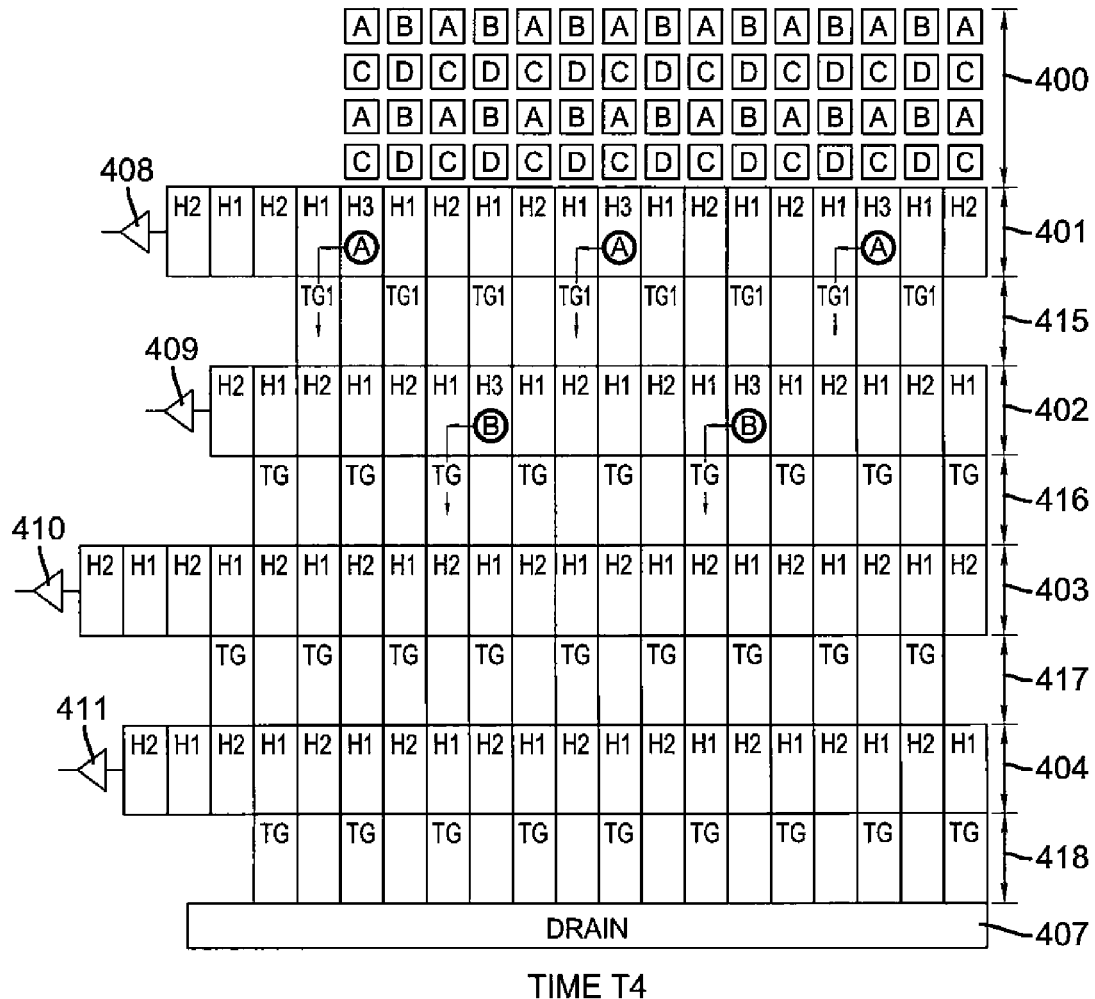
FIG. 21 shows the location of charge at time T4 of the third embodiment.
Figure 22:
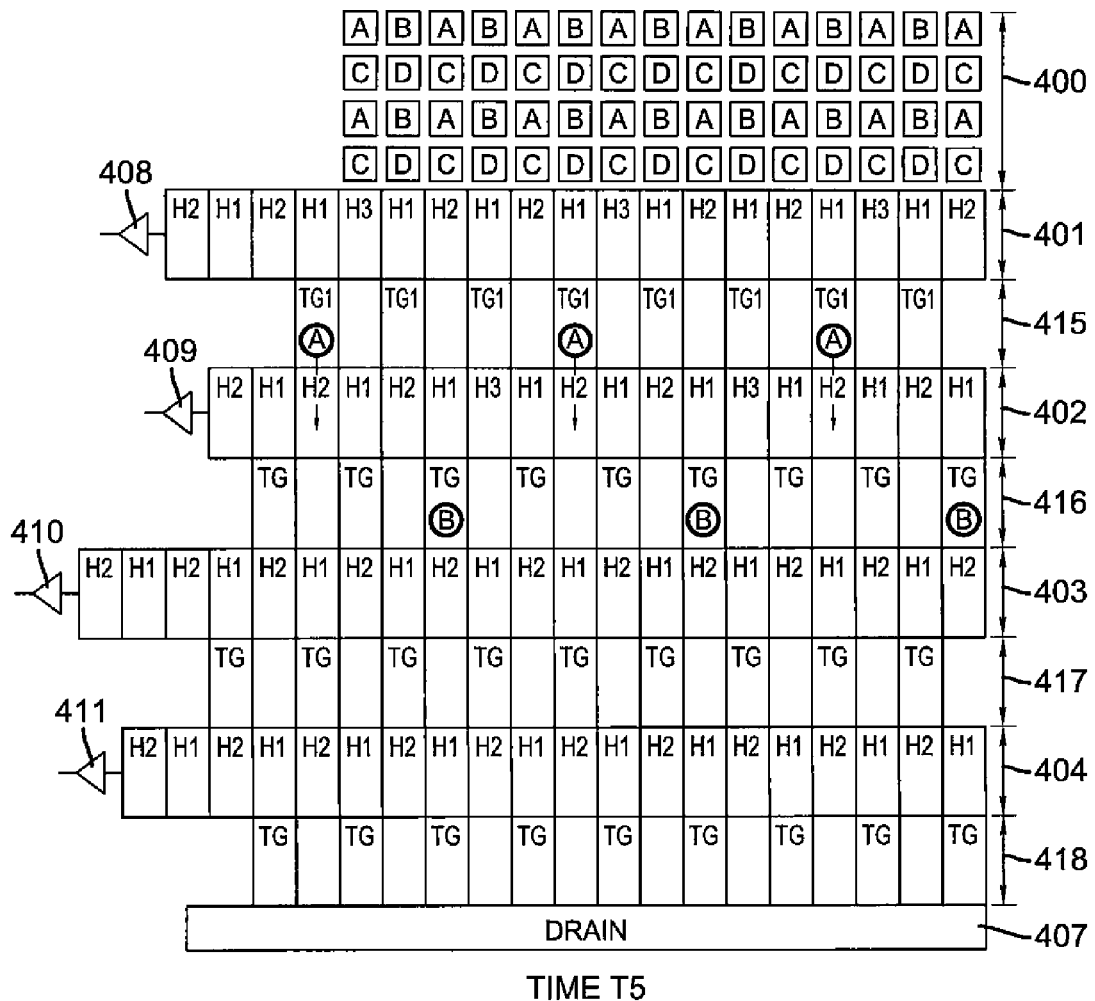
FIG. 22 shows the location of charge at time T5 of the third embodiment.
Figure 23:
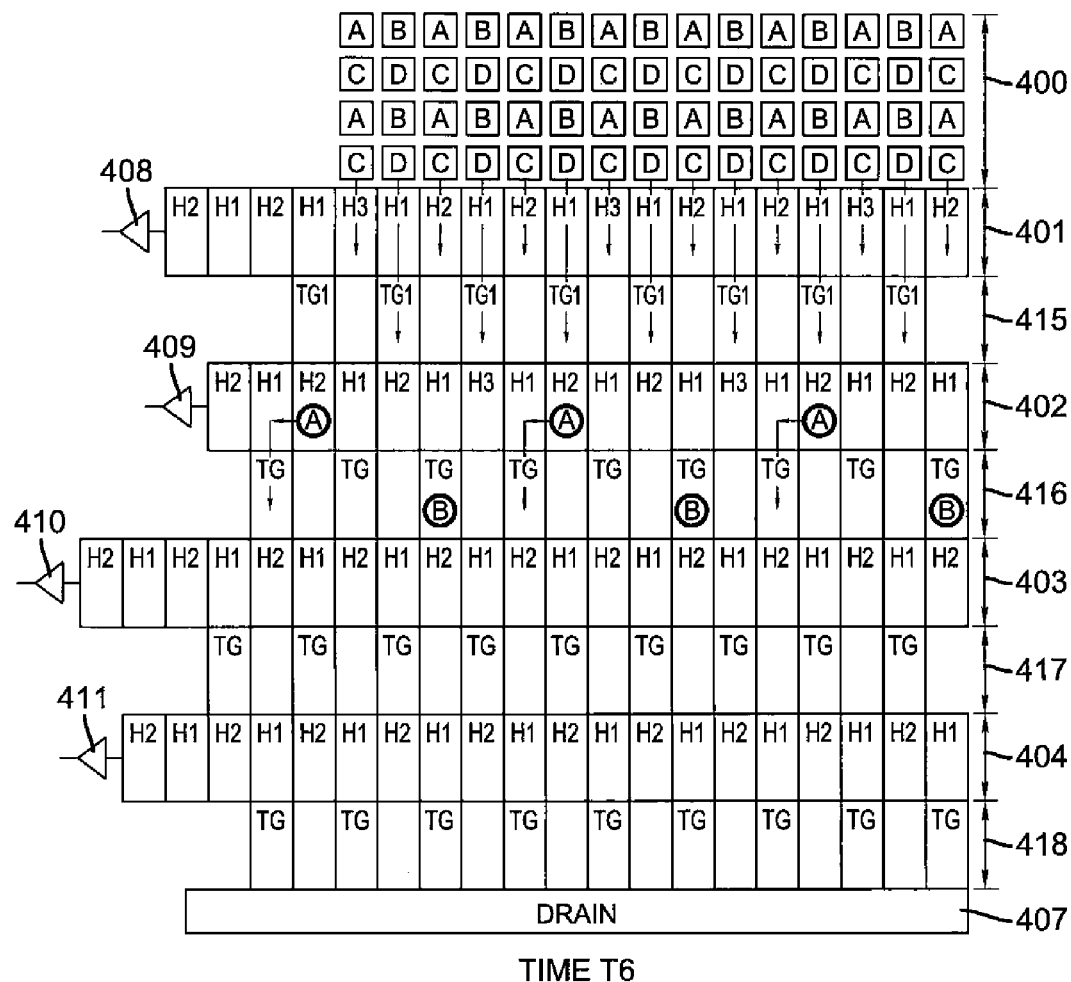
FIG. 23 shows the location of charge at time T6 of the third embodiment.
Figure 24:
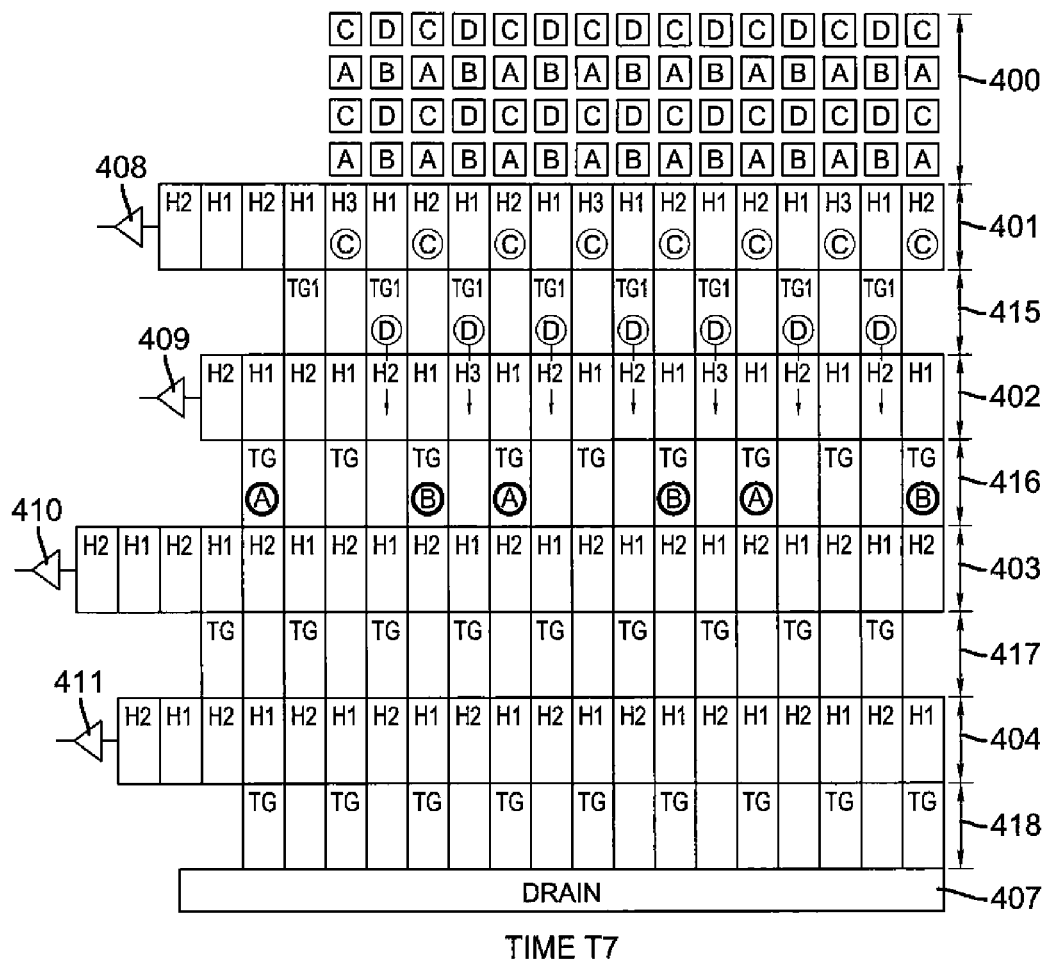
FIG. 24 shows the location of charge at time T7 of the third embodiment.
Figure 25:
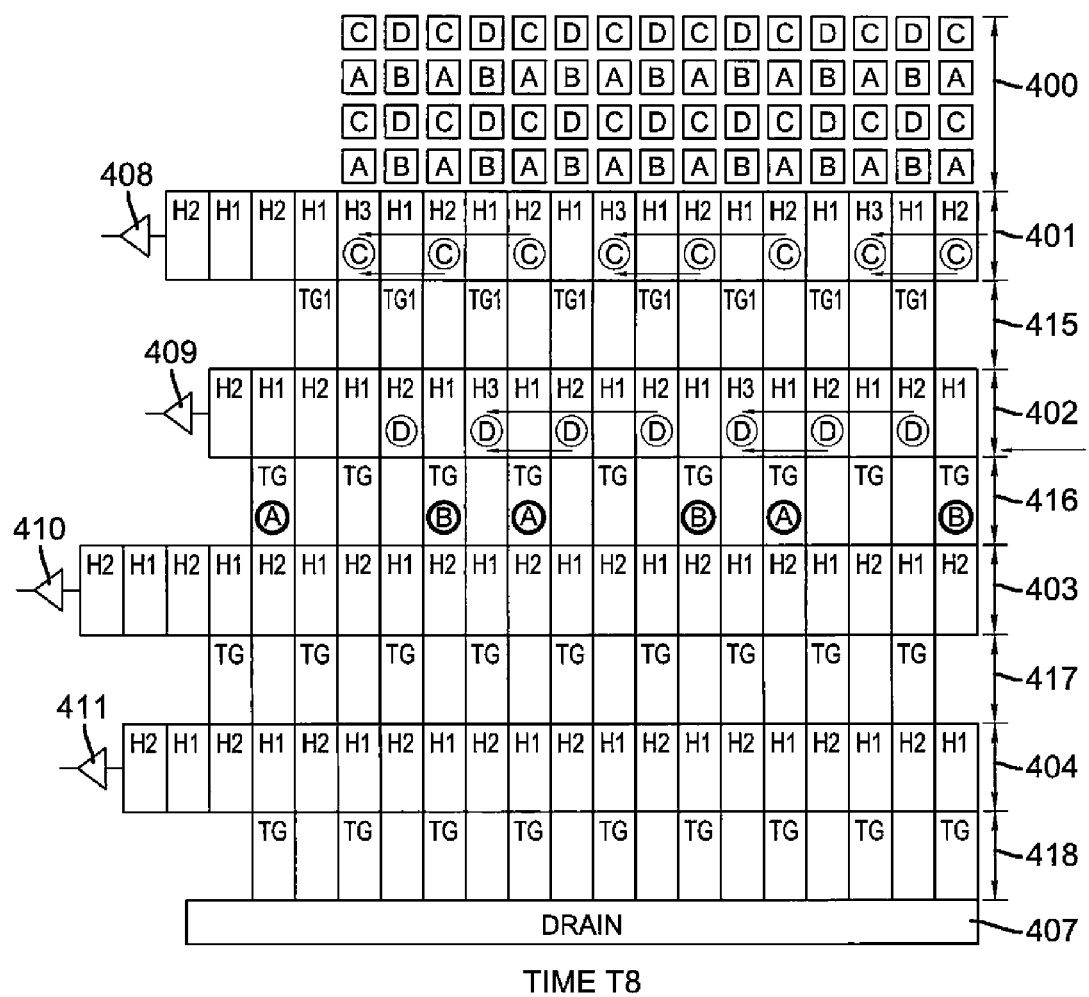
FIG. 25 shows the location of charge at time T8 of the third embodiment.
Figure 26:
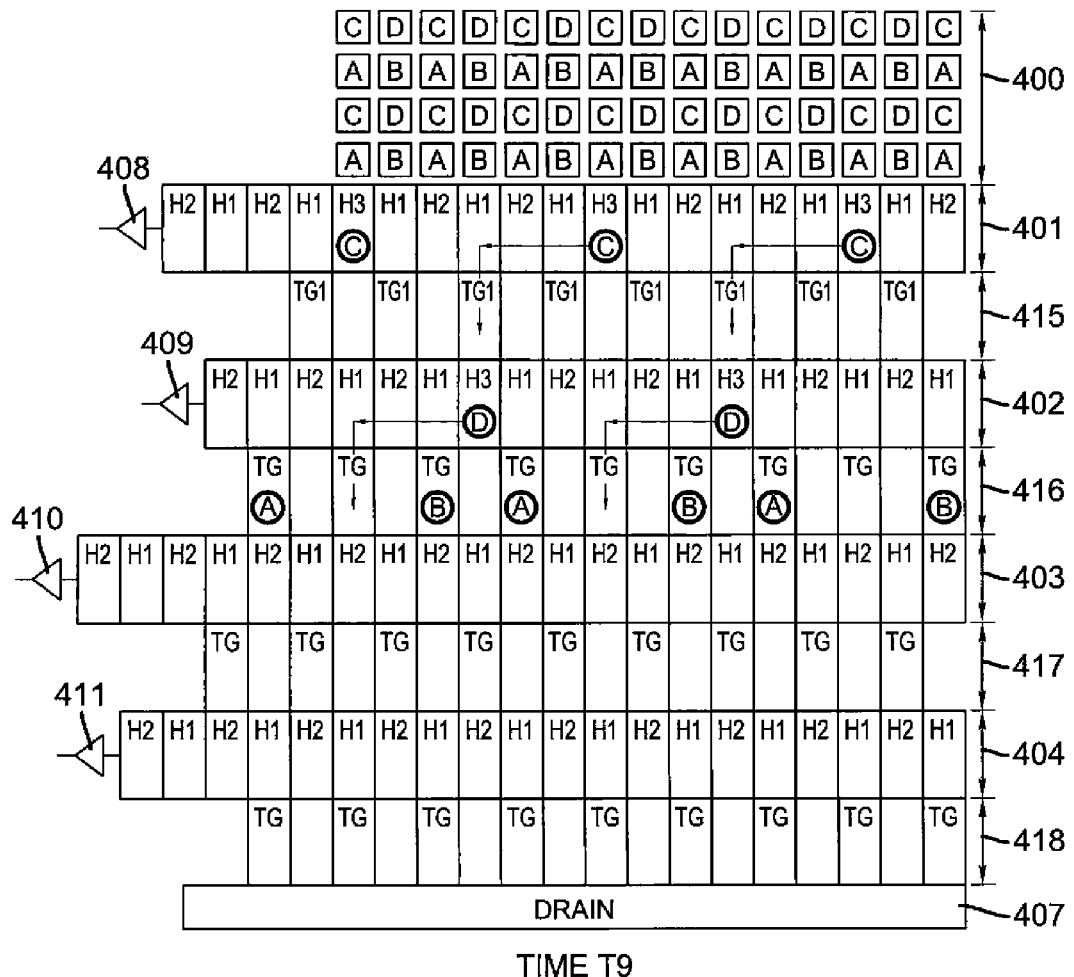
FIG. 26 shows the location of charge at time T9 of the third embodiment.
Figure 27:
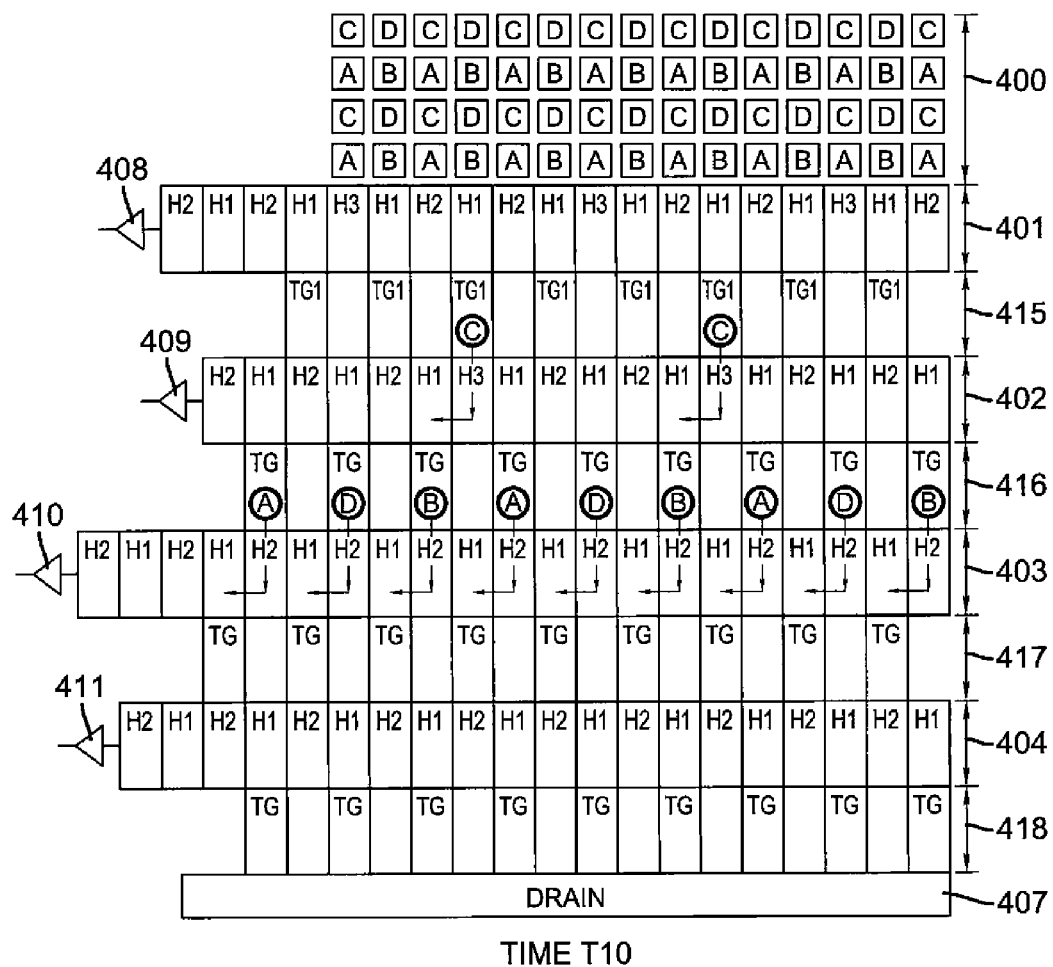
FIG. 27 shows the location of charge at time T10 of the third embodiment.
Figure 28:
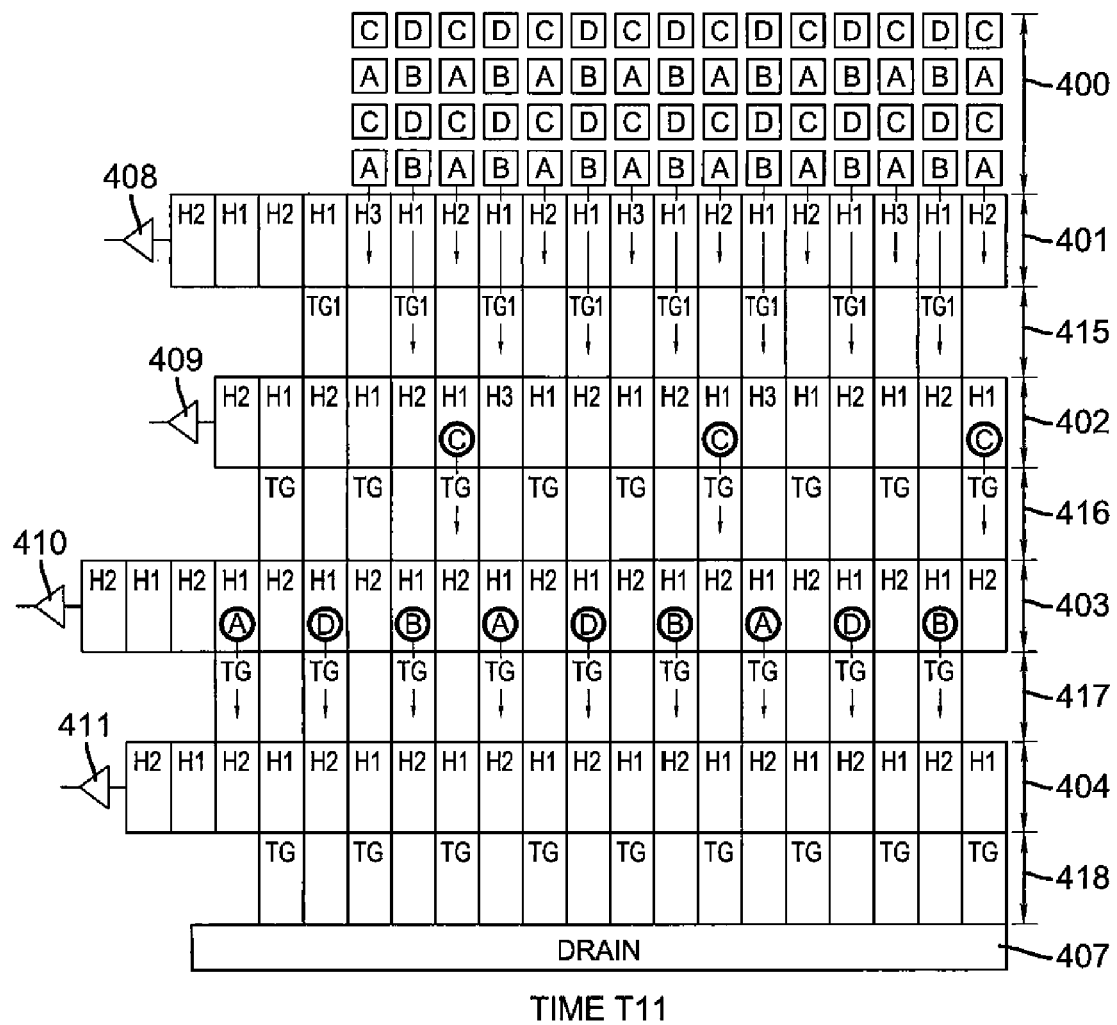
FIG. 28 shows the location of charge at time T11 of the third embodiment.
Figure 29:
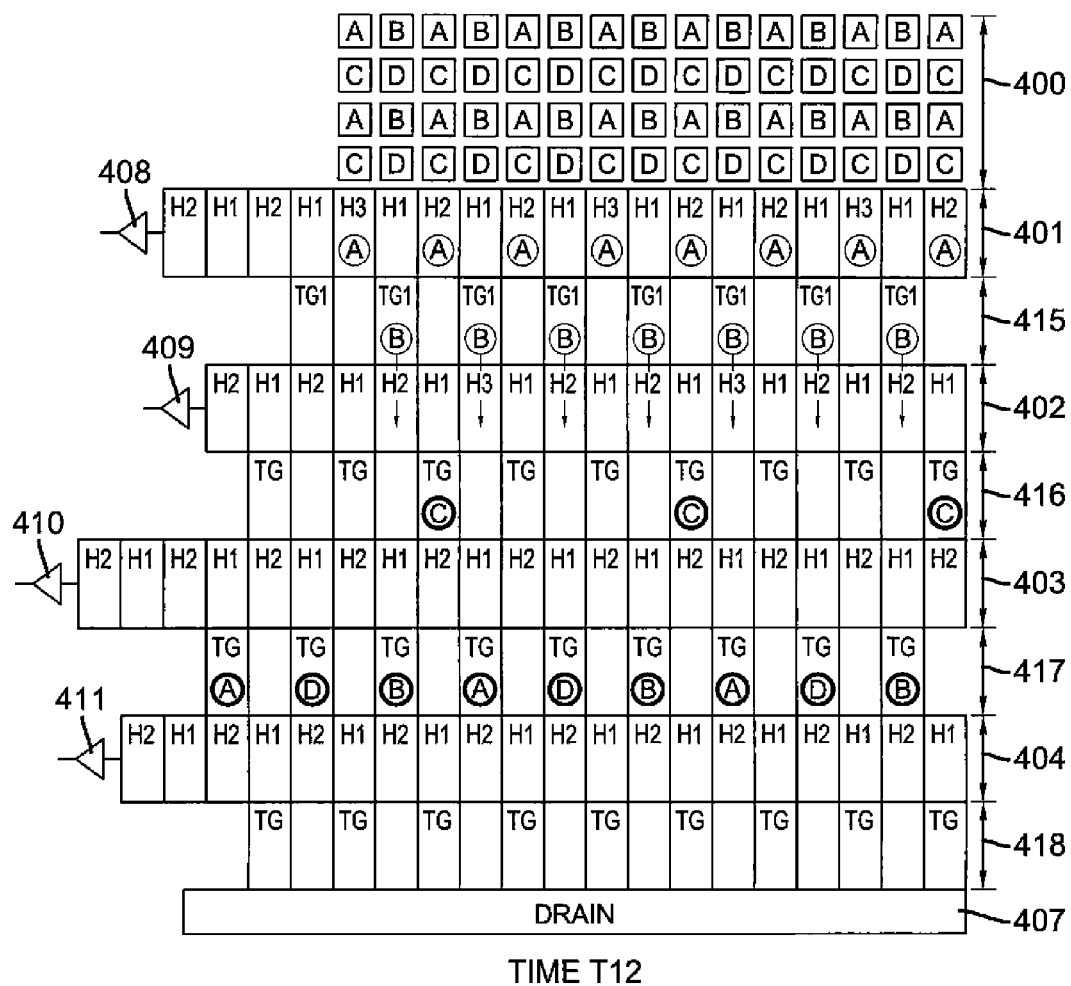
FIG. 29 shows the location of charge at time T12 of the third embodiment.
Figure 30:
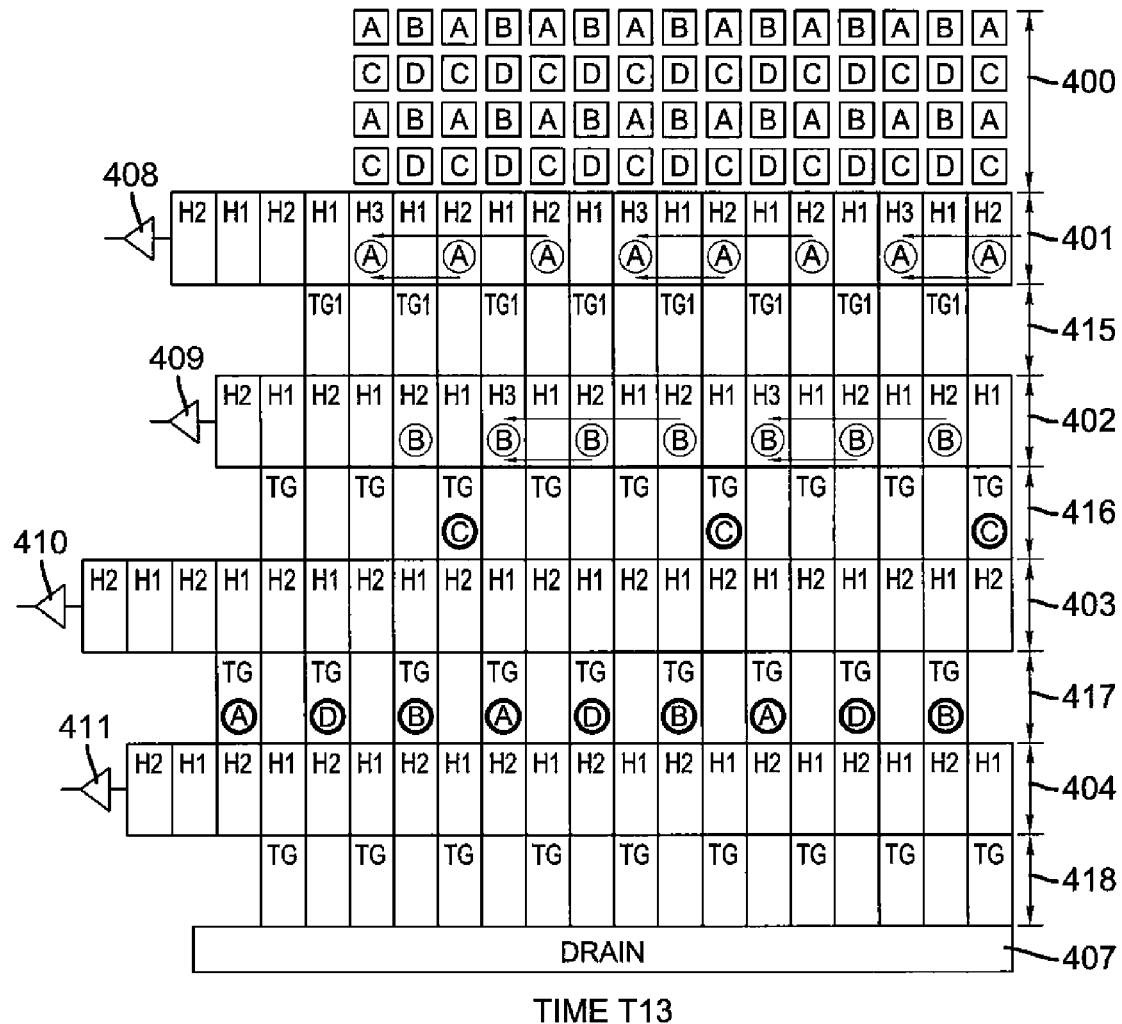
FIG. 30 shows the location of charge at time T13 of the third embodiment.
Figure 31:
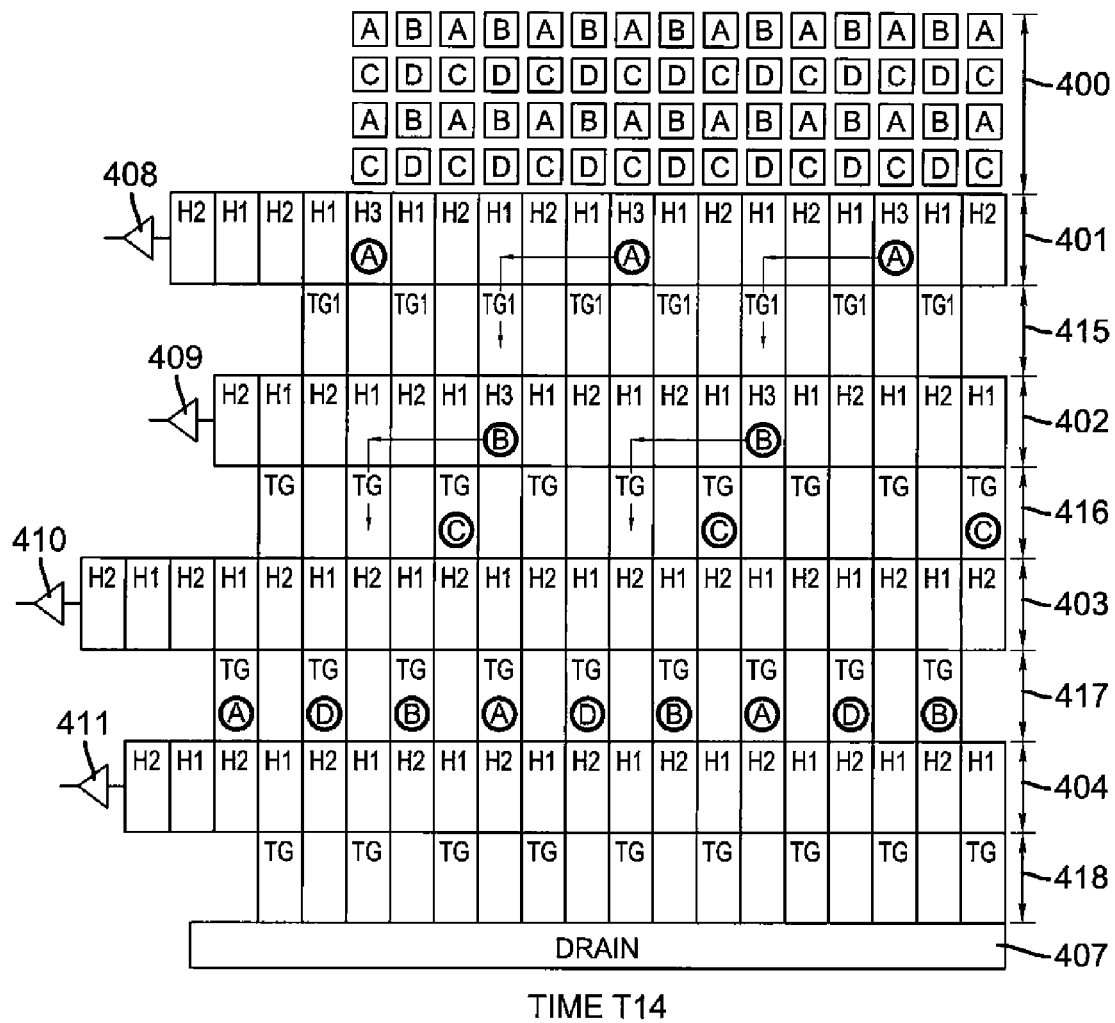
FIG. 31 shows the location of charge at time T14 of the third embodiment.
Figure 32:
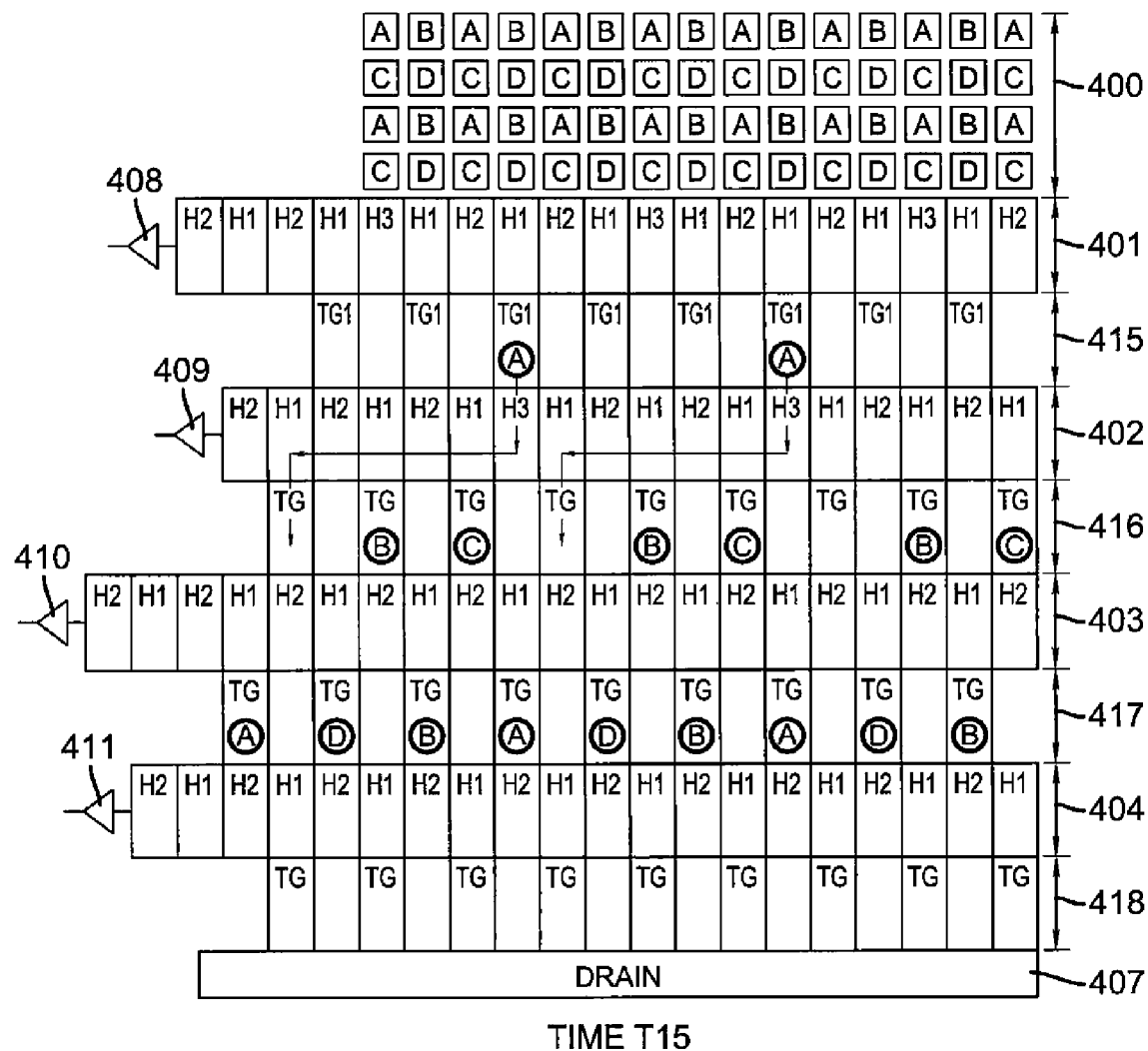
FIG. 32 shows the location of charge at time T15 of the third embodiment.
Figure 33:
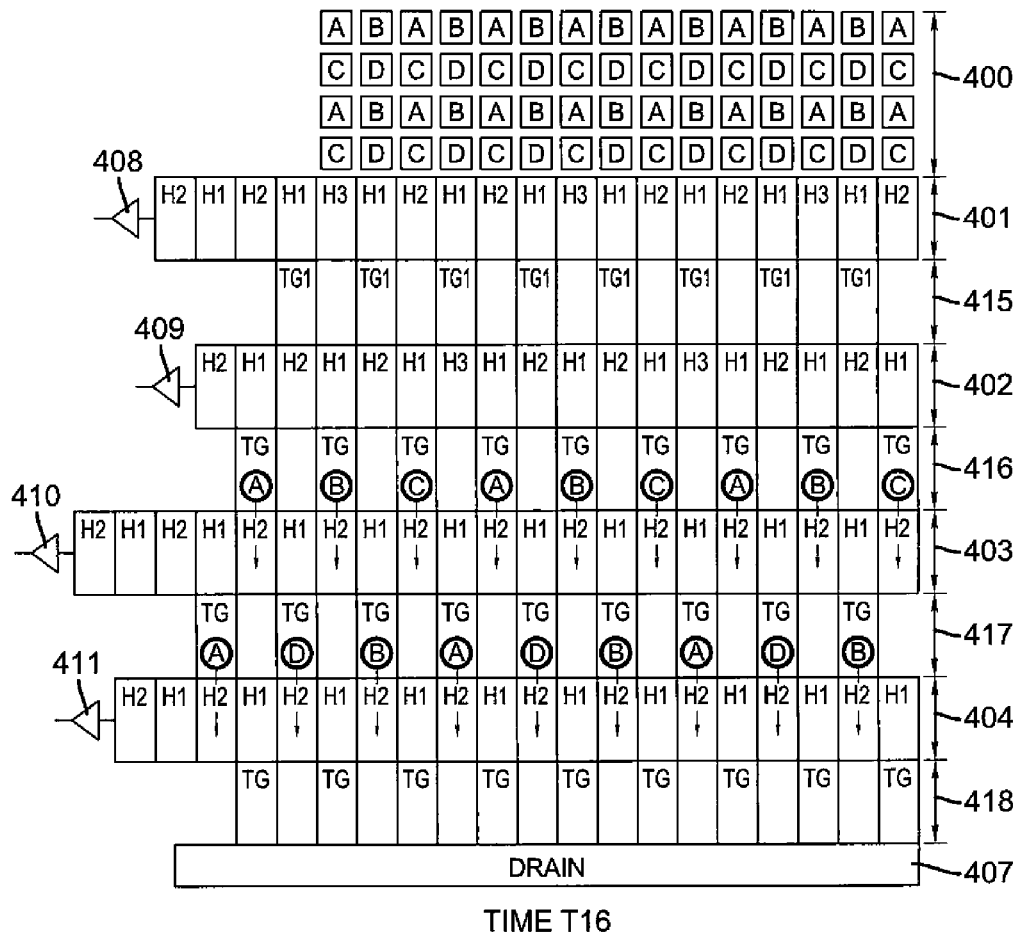
FIG. 33 shows the location of charge at time T16 of the third embodiment.

The charge summing process is now described. Each of the figures from FIG. 18 to FIG. 34 has a time stamp from T1 to T17 that corresponds to the time labels on FIG. 35. At time T1 in FIG. 18 the first row of colors A and B is transferred into HCCD 401 and transfer gate TG1 region 415. In FIG. 19 color B charge is transferred from the TG1 region 415 to HCCD 402 while color A charge remains in the HCCD 401. Next, in FIG. 20, the H1 and H2 gates are clock while the H3 gate is held in the high charge holding state. This has the effect of causing two charge packets to catch up to and sum with the charge packet held under the H3 gate. The result is shown in FIG. 21. A triple concentric circle to represent the sum of three charge packets now indicates the location of each charge packet. The summed charge packets are now transferred into the TG and TG1 transfer gates as shown in FIG. 22. Next, only the charge under the TG1 transfer gates is transferred into the HCCD 402 while charge in the TG transfer gate does not move. This allows the color A charge packets to catch up to the color B charge packets in FIG. 23. Next, in FIG. 24, a second row of charge containing colors C and D is transferred into HCCD 401 and TG1 region 415 while the previous summed row of charge is kept under transfer gate TG region 416. Holding one charge packet under the H3 gate sums the second row of charge by allowing the next two charge packets to sum on top of the first charge packet. In FIG. 25, the H1 and H2 gates clock charge forward while holding charge under the H3 gate stationary. In FIG. 26 the summed color D charge packets are transferred into the empty TG region 416 and the color C charge packets are transferred into the TG1 region 415. In FIG. 27 and FIG. 28 the charge packets are transferred into the next row of TG regions 416 and 417. The full set of summed charge packets in TG region 417 wait there while the next full set of summed charge packets is accumulated in TG region 416. In FIG. 29, a third row of charge colors A and B have been transferred into HCCD 401 and TG1 region 415. The third row of charge is summed in FIG. 30 by holding one charge packet under the H3 gate while clocking the H1 and H2 gates to accumulate a sum of three charge packets of the same color. In FIG. 31, the summed color B charge packets are transferred into the TG region 416 and the summed color A charge packets are transferred into the TG1 region 415. In FIG. 32, the summed color A charge packets are transferred through HCCD 402 and into TG region 416 to form a complete set of summed charge packets. In FIG. 33, all of the summed charge packets are transferred into HCCD 403 and HCCD 404.

Figure 34:
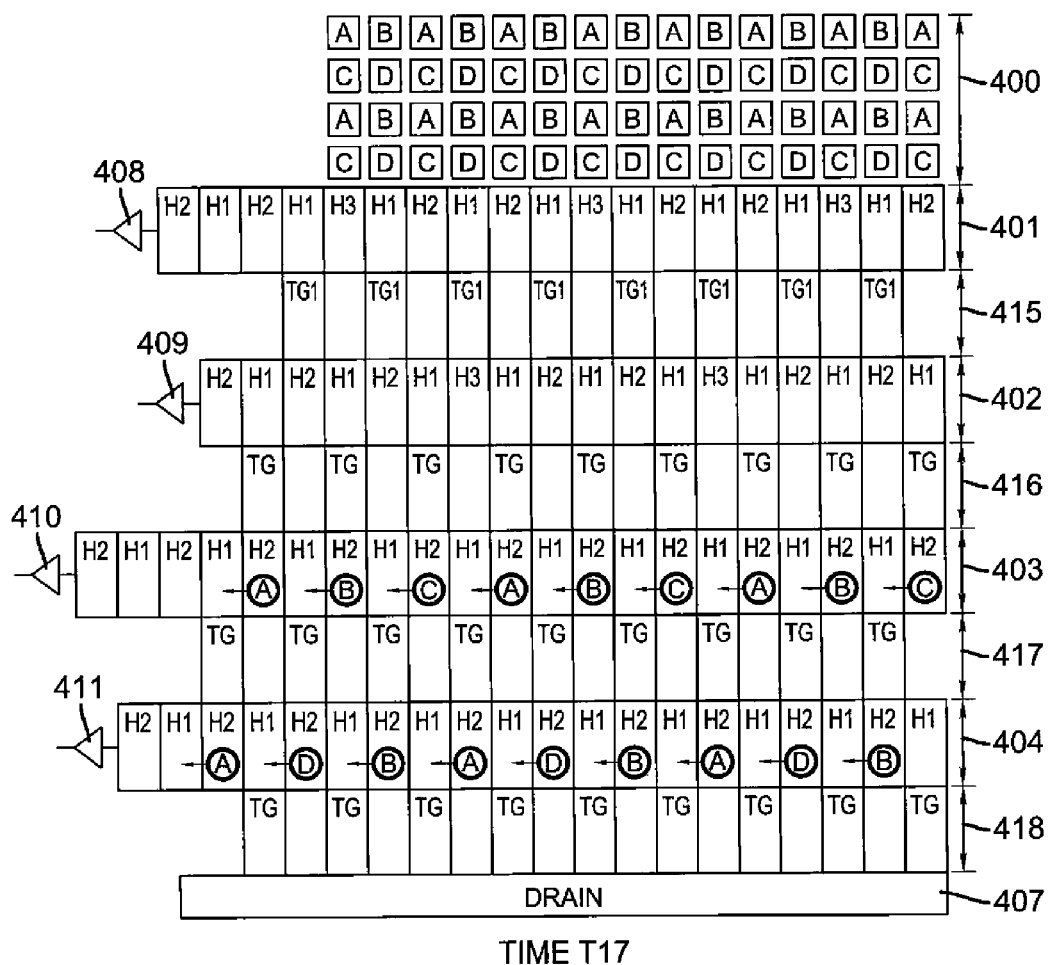
FIG. 34 shows the location of charge at time T17 of the third embodiment.
Figure 35:
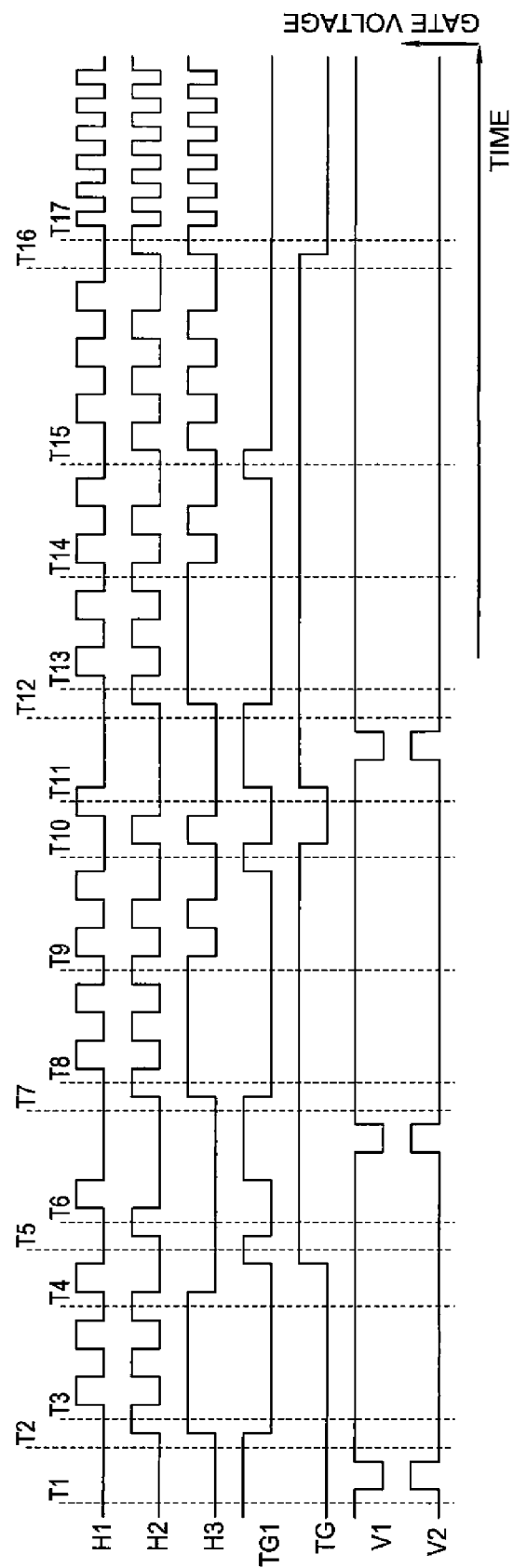
FIG. 35 shows the clock driver timing diagram for transfer of charge in FIGS. 18 through 34.

Finally, in FIG. 34, the HCCD 403 and HCCD 404 contain the summed charge of three rows in only two HCCD shift registers. The amplifiers 408 and 409 are turned off during this charge summed video mode to conserve power. When this 3-pixel summing process in the HCCD is also combined with a 3-pixel row summing in the vertical CCD shift register, a high quality video image of exactly nine times less resolution is obtained.

Thus far the third embodiment has been described in the context of summing three pixels together. It can be easily extended from two pixels to any arbitrary number of pixel summing. For example, suppose it is desired to sum together n pixels. The HCCD shift registers would be comprised of alternating H1 and H2 gates where every 2n gate is replaced by an H3 gate. If it were desired to sum together two pixels, then every $4^{th}$ gate would be an H3 gate. In the HCCD shown in FIG. 18, it is set up to sum three pixels thus there is an H3 gate every 2×3 or $6^{th}$ gate. To sum five pixels every $10^{th}$ gate would be an H3 gate. Combinations of pixel summing are also possible. To make a set of HCCD registers that can sum either two or four pixels there would be separately controllable H3 gates every $4^{th}$ and $8^{th}$ gate.

Figure 36:
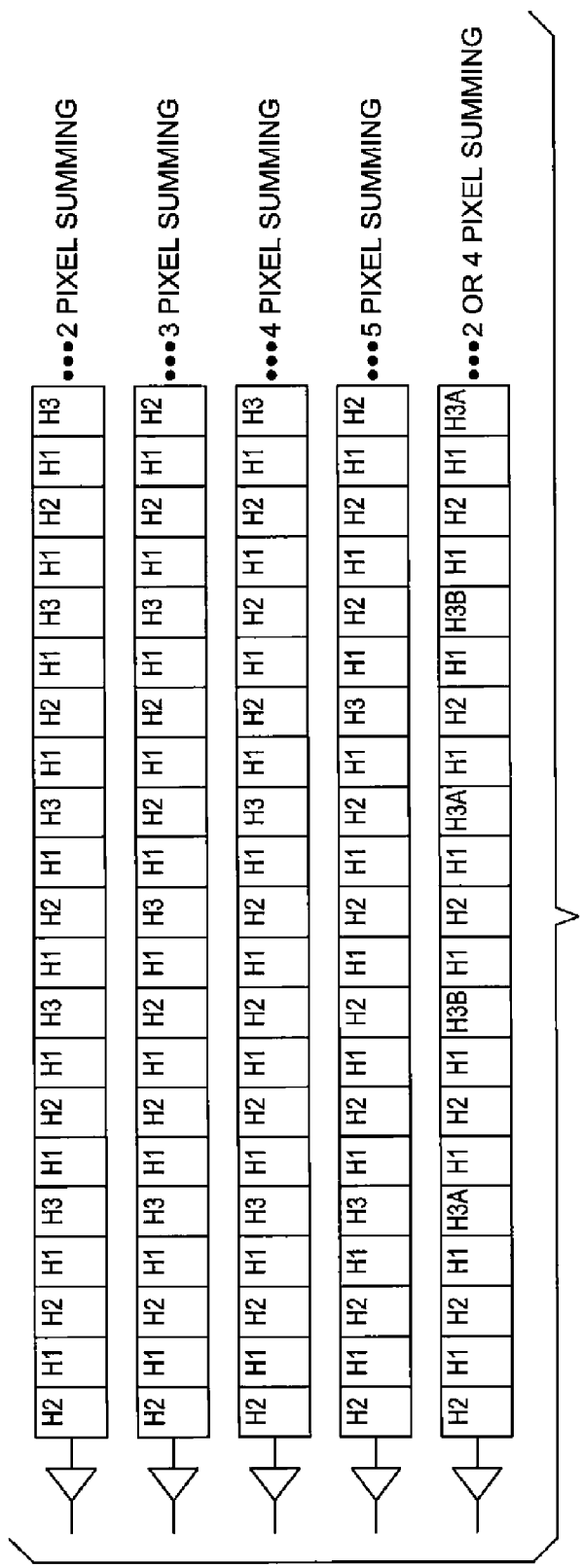
FIG. 36 shows the gate ordering for each CCD of the third embodiment for 2, 3, 4, 5, and 2 or 4 pixel summing.

The ordering of the H1, H2, and H3 gates in the first HCCD 401 is shown in FIG. 36 for 2, 3, 4, 5, and 2 or 4 pixel summing.

Figure 37:
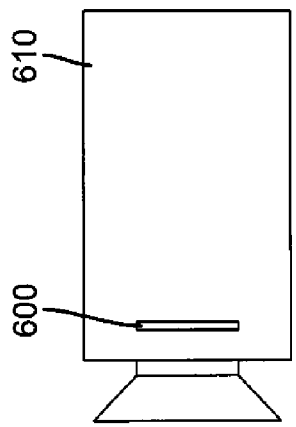
FIG. 37 shows a camera having an image sensor of the present invention.

FIG. 37 shows a camera 610 using an image sensor 600 employing one of the embodiments of the invention. Such a camera would take full resolution pictures using the multiple output HCCD shift registers described for increased picture taking rate compared to image sensors with only one output. It would also be able to change modes to a lower resolution with a frame rate of at least 30 frames/second for motion picture recording. The lower resolution modes can also be used for image preview, auto-exposure, and auto-focus. The invention provides a method of supplying enough HCCD shift registers to read out image sensors with millions of pixels (easily exceeding 5 million pixels) at full resolution and 30 frames/second.

The invention has been described in the context of a 2×2 color pixel pattern such as the Bayer color filter pattern. It is not limited to only 2×2 color patterns. The invention may also be applied to color patterns with a unit cell greater than two pixels on each side.

PARTS LIST 10 insulator
11 CCD buried channel
12 substrate
13 channel potential barrier implants
100 plurality of pixels or pixel array
101 horizontal charge-coupled device (HCCD)/shift register
102 horizontal charge-coupled device (HCCD)/shift register
103 horizontal charge-coupled device (HCCD)/shift register
104 horizontal charge-coupled device (HCCD)/shift register
105 fast charge dump drain
106 charge sensing output amplifier
107 charge sensing output amplifier
108 charge sensing output amplifier
109 charge sensing output amplifier
200 pixel array
201 horizontal charge-coupled device (HCCD)/shift register
202 horizontal charge-coupled device (HCCD)/shift register
203 horizontal charge-coupled device (HCCD)/shift register
204 horizontal charge-coupled device (HCCD)/shift register
205 horizontal charge-coupled device (HCCD)/shift register
206 horizontal charge-coupled device (HCCD)/shift register
207 fast charge dump drain
208 charge sensing output amplifier
209 charge sensing output amplifier
210 charge sensing output amplifier
211 charge sensing output amplifier
212 charge sensing output amplifier
213 charge sensing output amplifier
220 region
221 region
222 region
223 region
224 region
225 region
300 pixel array
301 horizontal charge-coupled device (HCCD)/shift register
302 horizontal charge-coupled device (HCCD)/shift register
303 horizontal charge-coupled device (HCCD)/shift register
307 fast charge dump drain
308 amplifier
309 amplifier
310 amplifier
400 plurality of pixels/pixel array
401 horizontal charge-coupled device (HCCD)/shift register
402 horizontal charge-coupled device (HCCD)/shift register
403 horizontal charge-coupled device (HCCD)/shift register
404 horizontal charge-coupled device (HCCD)/shift register
407 fast charge dump drain
408 charge sensing output amplifier
409 charge sensing output amplifier
410 charge sensing output amplifier
411 charge sensing output amplifier
415 region
416 region
417 region
418 region
600 image sensor
610 camera

The invention claimed is:
1. An image sensor comprising:
a plurality of pixels overlaid with a color filter pattern of at least two colors having the same color on every other pixel in one direction;
four or more charge-coupled devices for receiving charge from the plurality of pixels, wherein the four or more charge-coupled devices are oriented parallel to the one direction with each charge-coupled device having first and second gates for shifting charge through the charge-coupled device and all first gates are electrically connected together and all second gates are electrically connected together; and CCD-to-CCD transfer gates disposed between adjacent charge-coupled devices for transferring charge between the charge-coupled devices, wherein the first gate of a charge-coupled device is disposed on one side of a respective CCD-to-CCD transfer gate and the second gate of a charge-coupled device adjacent to the respective CCD-to-CCD transfer gate is disposed on an opposite side of the respective CCD-to-CCD transfer gate; and wherein all CCD-to-CCD transfer gates are electrically connected together.

2. The image sensor as in claim 1, further comprising a charge drain connected by a CCD transfer gate to the charge-coupled device furthest from the plurality of pixels.

3. The image sensor as in claim 1, wherein the color filter pattern is a 2×2 pixel Bayer color filter pattern having two green pixels, one red pixel, and one blue pixel.

4. The image sensor as in claim 1, further comprising a charge sensing amplifier connected to an output of at least two of the charge couple devices.

5. The image sensor as in claim 1, further comprising:
one or more additional charge-coupled devices oriented parallel to the first, second, third, and fourth charge-coupled devices, wherein each additional charge-coupled device has alternating first and second gates for shifting charge through the charge-coupled device; and
CCD-to-CCD transfer gates disposed between adjacent charge-coupled devices.

6. A camera comprising:
an image sensor comprising:
a plurality of pixels overlaid with a color filter pattern of at least two colors having the same color on every other pixel in one direction;
four or more charge-coupled devices for receiving charge from the plurality of pixels, wherein the four or more charge-coupled devices are oriented parallel to the one direction with each charge-coupled device having first and second gates for shifting charge through the charge-coupled device and all first gates are electrically connected together and all second gates are electrically connected together; and
CCD-to-CCD transfer gates disposed between adjacent charge-coupled devices for transferring charge between the charge-coupled devices, wherein the first gate of a charge-coupled device is disposed on one side of a respective CCD-to-CCD transfer gate and the second gate of a charge-coupled device adjacent to the respective CCD-to-CCD transfer gate is disposed on an opposite side of the respective CCD-to-CCD transfer gate; and wherein all CCD-to-CCD transfer gates are electrically connected together.

7. The camera as in claim 6, further comprising a charge drain connected by a CCD transfer gate to the charge-coupled device furthest from the plurality of pixels.

8. The camera as in claim 6, wherein the color filter pattern is a 2×2 pixel Bayer color filter pattern having two green pixels, one red pixel, and one blue pixel.

9. The camera as in claim 6, further comprising a charge sensing amplifier connected to an output of at least two of the charge couple devices.

10. An image sensor comprising:
four charge-coupled devices oriented parallel to each other each charge-coupled device having alternating first and second gates for shifting charge through the charge-coupled device with all first gates electrically connected together and all second gates electrically connected together, wherein a first charge-coupled device receives charge from a plurality of pixels, a second charge-coupled device receives charge from the first charge-coupled device, a third charge-coupled device receives charge from the second charge-coupled device, and a fourth charge-coupled device receives charge from the third charge-coupled device; and
CCD-to-CCD transfer gates disposed between adjacent charge-coupled devices for transferring charge between the charge-coupled devices, wherein a CCD-to CCD transfer gate is disposed between the first gate of the first charge-coupled device and the second gate of the second charge-coupled device, a CCD-to-CCD transfer gate is disposed between the first gate of the second charge-coupled device and the second gate of the third charge-coupled device, a CCD-to-CCD transfer gate is disposed between the first gate of the third charge-coupled device and the second gate of the fourth charge-coupled device, and all CCD-to-CCD transfer gates are electrically connected together.

11. The image sensor as in claim 10, further comprising a charge drain connected to the first gate of the fourth charge-coupled device by a CCD transfer gate.

12. The image sensor as in claim 10, further comprising a charge sensing amplifier connected to an output of at least two of the charge couple devices.

13. The image sensor as in claim 10, further comprising a color filter overlying the plurality of pixels with the color filter including a pattern of at least two colors having the same color on every other pixel in one direction.

14. The image sensor as in claim 13, wherein the color filter comprises a Bayer color filter.

* * * * *

UNITED STATES PATENT AND TRADEMARK OFFICE
CERTIFICATE OF CORRECTION

PATENT NO.          : 8,098,316 B2                                    Page 1 of 1
APPLICATION NO.     : 12/716361
DATED               : January 17, 2012
INVENTOR(S)         : Christopher Parks It is certified that error appears in the above-identified patent and that said Letters Patent is hereby corrected as shown below:

Title Page: Item 62

<u>Bibliographic Information</u>

Column 1, insert --Related U.S. Application Data

Division of application No. 11/490,383, filed on July 20, 2006, now Pat. No. 7,692,706.--

Signed and Sealed this
Sixth Day of March, 2012

David J. Kappos
*Director of the United States Patent and Trademark Office*